US009768015B2

(12) United States Patent
Mansfield et al.

(10) Patent No.: US 9,768,015 B2
(45) Date of Patent: Sep. 19, 2017

(54) METHODS OF FORMING CIGS FILMS

(71) Applicant: Alliance for Sustainable Energy, LLC, Golden, CO (US)

(72) Inventors: Lorelle Mansfield, Northglenn, CO (US); Kannan Ramanathan, San Jose, CA (US)

(73) Assignee: Alliance for Sustainable Energy, LLC, Golden, CO (US)

( * ) Notice: Subject to any disclaimer, the term of this patent is extended or adjusted under 35 U.S.C. 154(b) by 0 days.

(21) Appl. No.: 15/170,480

(22) Filed: Jun. 1, 2016

(65) Prior Publication Data

US 2016/0365471 A1    Dec. 15, 2016

Related U.S. Application Data

(60) Provisional application No. 62/174,135, filed on Jun. 11, 2015.

(51) Int. Cl.
*H01L 21/02* (2006.01)
*H01L 31/032* (2006.01)

(52) U.S. Cl.
CPC .. *H01L 21/02614* (2013.01); *H01L 21/02568* (2013.01); *H01L 21/02631* (2013.01); *H01L 31/0322* (2013.01); *Y02E 10/50* (2013.01); *Y02P 70/521* (2015.11)

(58) Field of Classification Search
CPC ..................................................... H01L 21/02
See application file for complete search history.

(56) References Cited

U.S. PATENT DOCUMENTS

| 8,802,977 B2 | 8/2014 | Yuan et al. | |
| 2006/0222558 A1* | 10/2006 | Alberts | H01L 31/0322 420/500 |
| 2008/0096307 A1* | 4/2008 | Basol | C23C 14/14 438/104 |
| 2009/0320916 A1* | 12/2009 | Yuan | C23C 18/08 136/256 |

OTHER PUBLICATIONS

PCTIB2013060981.*
Contreras et al., "High Efficiency Cu(In,Ga)Se$_2$-Based Solar Cells: Processing of Novel Absorber Structures", First WCPEC, Dec. 5-9, 1994, Hawaii, pp. 68-75.
Contreras et al., "Progress Toward 20% Efficiency in Cu(In,Ga)Se$_2$ Polycrystalline Thin-film Solar Cells", Progress in Photovoltaics, Jul./Aug. 1999, vol. 7, No. 4, pp. 311-316.
(Continued)

*Primary Examiner* — Kyoung Lee
*Assistant Examiner* — Christina Sylvia
(74) *Attorney, Agent, or Firm* — Suzanne C. Walts

(57) ABSTRACT

Methods for forming CIGS films are provided. According to an aspect of the invention, a method of forming a CIGS film includes a precursor step, which includes simultaneously evaporating Cu, In, Ga, Se, and Sb onto a substrate. The Se is incident on the substrate at a rate of at least 20 Å/s. The method also includes a selenization step, which includes evaporating Se over the substrate after the precursor step.

20 Claims, 29 Drawing Sheets

(56) References Cited

OTHER PUBLICATIONS

Contreras et al., "Optimization of CBD CdS Process in High-efficiency Cu(In, Ga)Se$_2$-based Solar Cells", Thin Solid Films, 2002, vols. 403-404, pp. 204-211.

Dullweber et al., "Back Surface Band Gap Gradings in Cu(In,Ga)Se$_2$ Solar Cells", Thin Solid Films, 2001, vol. 387, pp. 11-13.

Gabor et al., "High-efficiency CuIn$_x$Ga$_{1-x}$Se$_2$ Solar Cells Made from (In$_x$,Ga$_{1-x}$)$_2$Se$_3$ Precursor Films", Applied Physics Letters, Jul. 1994, vol. 65, No. 2, pp. 198-200.

Gloeckler et al., "Band-gap Grading in Cu(In,Ga)Se$_2$ Solar Cells", Journal of Physics and Chemistry of Solids, 2005, vol. 66, pp. 1891-1894.

Ishizuka et al., "Rapid Fabrication of Cu(In, Ga)Se$_2$ Thin Films by the Two-step Selenization Process", IEEE Journal of Photovoltaics, Jan. 2013, vol. 3, No. 1, pp. 476-482.

Jackson et al., "Properties of Cu(In,Ga)Se$_2$ Solar Cells with New Record Efficiencies up to 21.7%", Physica Status Solidi (RRL)—Rapid Research Letters, Jan. 2015, vol. 9, No. 1, pp. 28-31.

Kim et al., "Composition and Bandgap Control in Cu(In,Ga)Se$_2$-based Absorbers Formed by Reaction of Metal Precursors", Progress in Photovoltaics: Research and Applications, 2015, vol. 23, pp. 765-772.

Li et al., "A Recombination Analysis of Cu(In,Ga)Se$_2$ Solar Cells with Low and High Ga Compositions", Solar Energy Materials & Solar Cells, 2014, vol. 124, pp. 143-149.

Lundberg et al., "The Effect of Ga-grading in CIGS Thin Film Solar Cells", Thin Solid Films, 2005, vols. 480-481, pp. 520-525.

Park et al., "Defect Properties of Sb- and Bi-doped CuInSe$_2$: The Effect of the Deep Lone-pair $s$ States", Applied Physics Letters, 2014, vol. 105, pp. 243901-1-243901-4.

Romero et al., "Comparative Study of the Luminescence and Intrinsic Point Defects in the Kesterite Cu$_2$ZnSnS$_4$ and Chalcopyrite Cu(In,Ga)Se$_2$ Thin Films Used in Photovoltaic Applications", Physical Review B, 2011, vol. 84, pp. 165324-1-165324-5.

Schmidtke, "Commercial Status of Thin-film Photovoltaic Devices and Materials", Optics Express, Sep. 2010, vol. 18, No. S3, pp. A477-A486.

Tseng et al., "Surfactant Modified Growth of CuInSe$_2$ Thin Films", Applied Surface Science, Feb. 1996, vol. 92, pp. 227-231.

Van Puyvelde et al., "Influence of an Sb Doping Layer in CIGS Thin-film Solar Cells: A Photoluminescence Study", Journal of Physics D: Applied Physics, 2014, vol. 47, pp. 1-8.

Van Puyvelde et al., "Electronic Defect Study on Low Temperature Processed Cu(In,Ga)Se$_2$ Thin-film Solar Cells and the Influence of an Sb Layer", Journal of Physics D: Applied Physics, 2015, vol. 48, No. 17, pp. 1-7.

Yatsushiro et al., "Effects of Antimony Doping on Cu(In$_{1-x}$,Ga$_x$)Se$_2$ Thin Films and Solar Cells", Japanese Journal of Applied Physics, 2012, vol. 51, pp. 10NC25-1-10NC25-4.

Yuan et al., "Antimony Assisted Low-temperature Processing of CuIn$_{1-x}$Ga$_x$Se$_{2-y}$S$_y$ Solar Cells", Thin Solid Films, 2010, vol. 519, No. 2, pp. 852-856.

Yuan et al., "Optimization of CIGS-Based PV Device Through Antimony Doping", Chemistry of Materials, 2010, vol. 22, No. 2, pp. 285-287.

\* cited by examiner

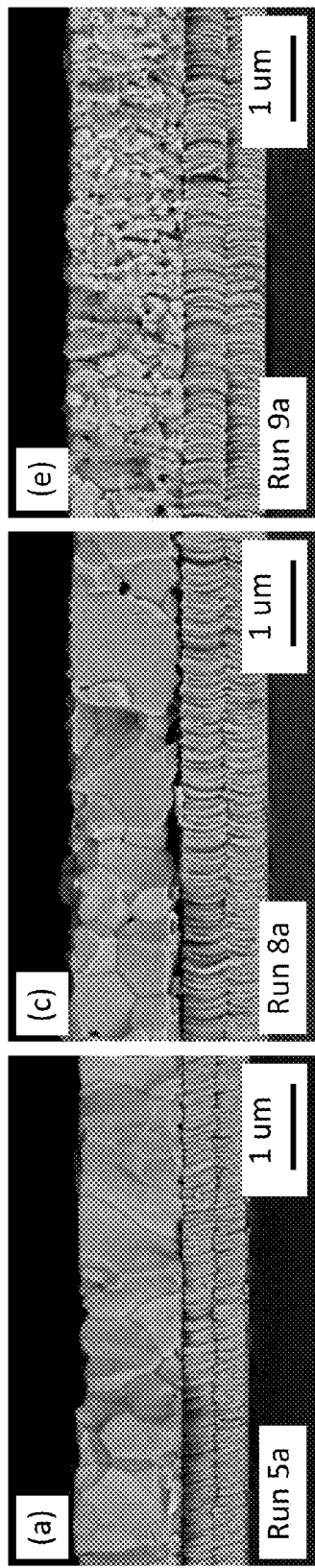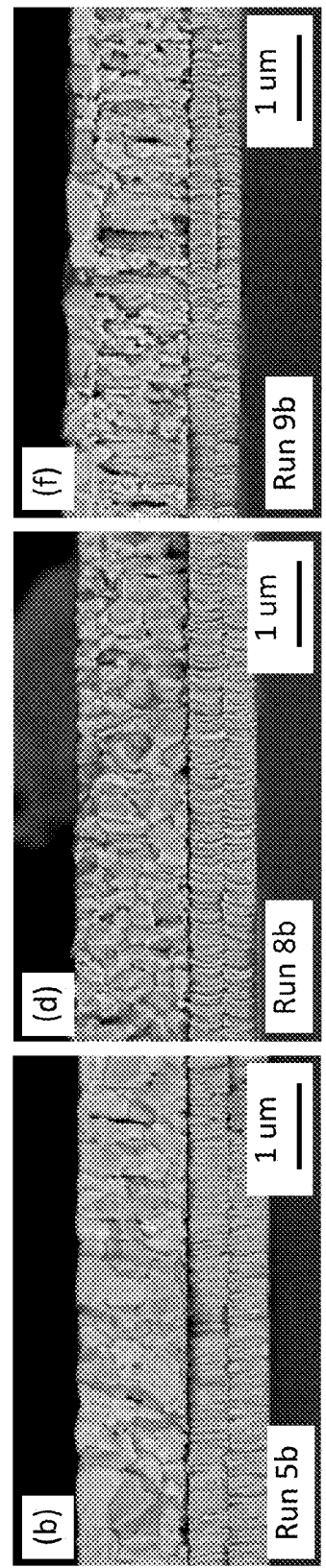
Fig. 5(a) Fig. 5(b)
Fig. 5(c) Fig. 5(d)
Fig. 5(e) Fig. 5(f)

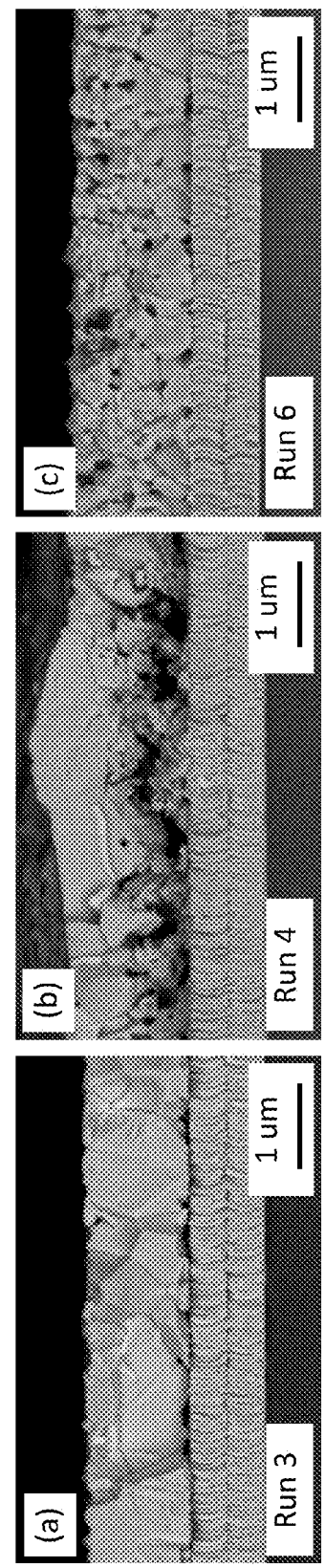

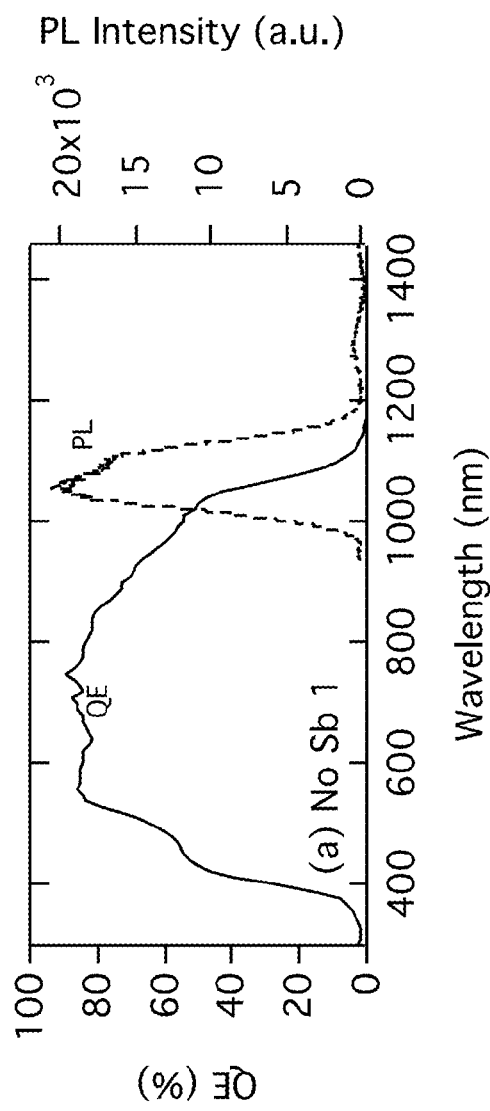
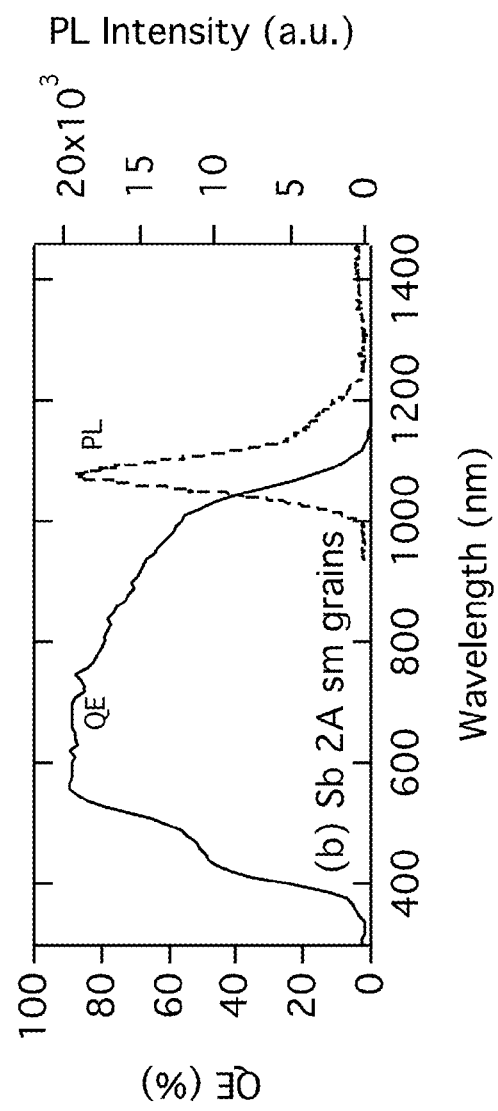
Fig. 12(a)
Fig. 12(b)

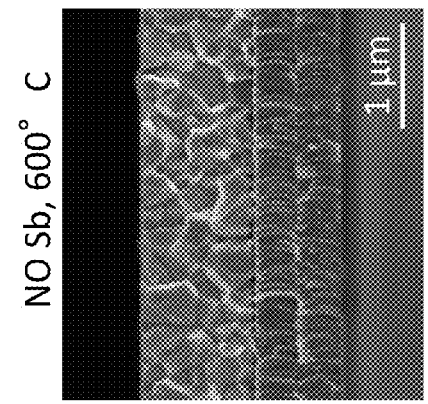
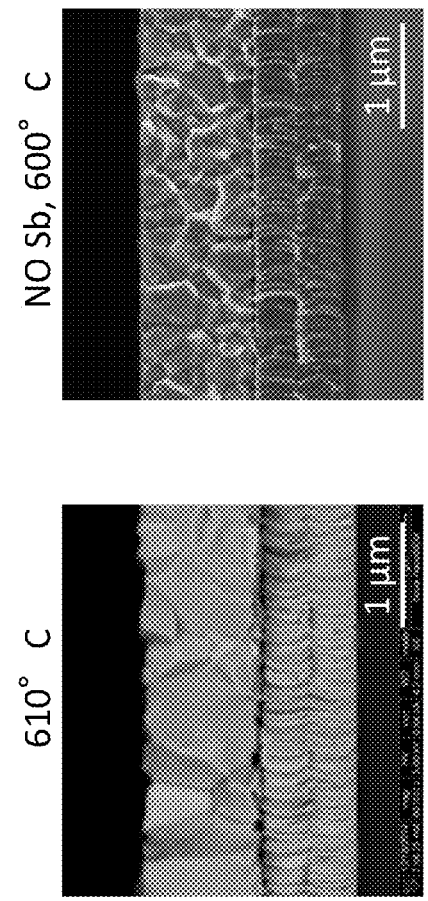
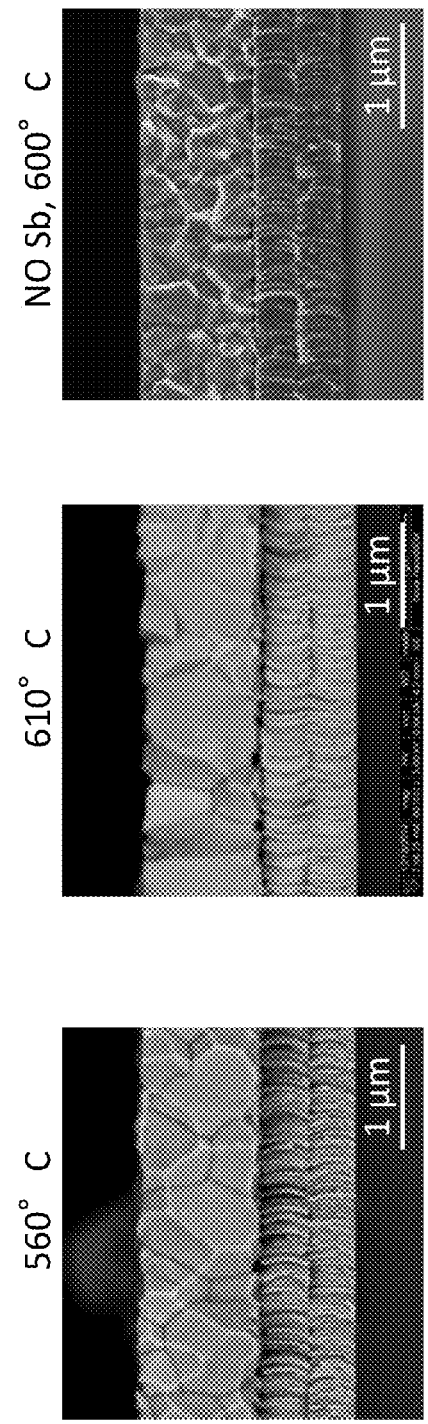
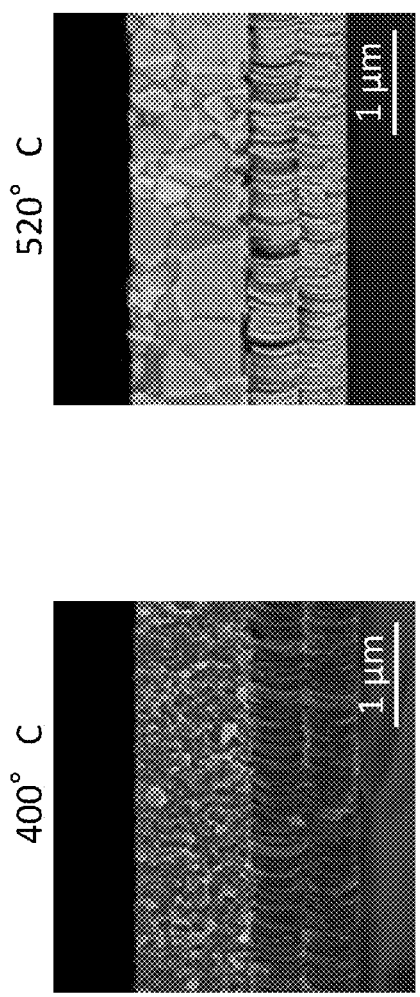
Fig. 19(a) 400° C
Fig. 19(b) 520° C
Fig. 19(c) 560° C
Fig. 19(d) 610° C
Fig. 19(e) NO Sb, 600° C

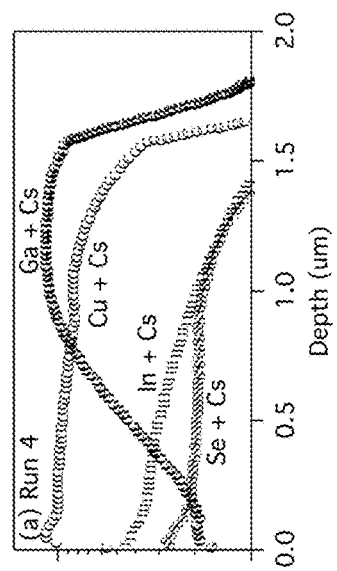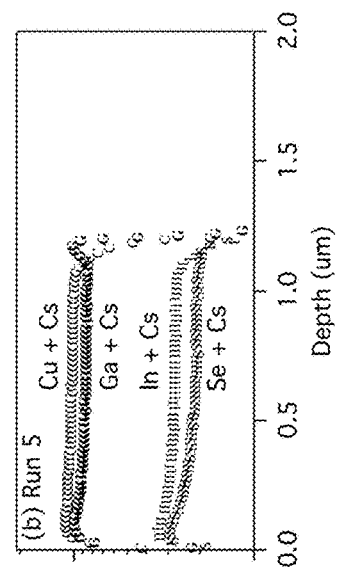

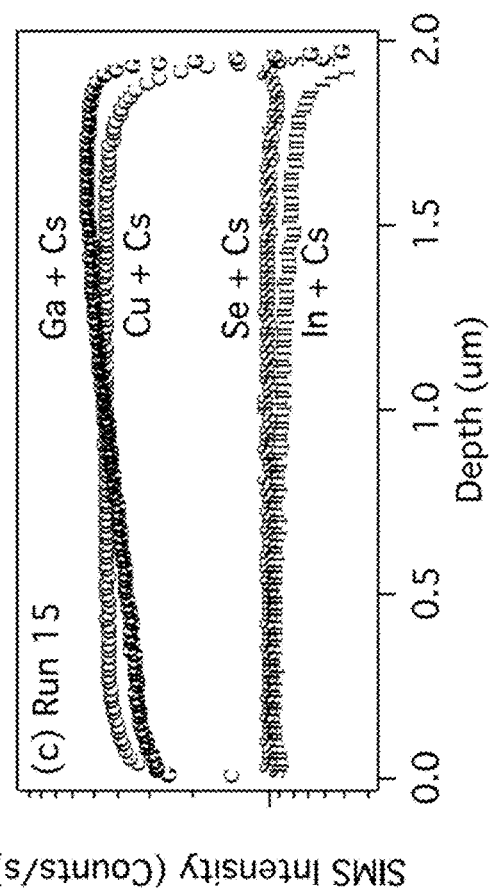

METHODS OF FORMING CIGS FILMS

CROSS-REFERENCE TO RELATED APPLICATIONS

This application claims priority under 35 U.S.C. §119 to U.S. Provisional Patent Application No. 62/174,135, filed on Jun. 11, 2015, the contents of which are hereby incorporated by reference in their entirety.

CONTRACTUAL ORIGIN

The United States Government has rights in this invention under Contract No. DEAC36-08GO28308 between the United States Department of Energy and the Alliance for Sustainable Energy, LLC, the Manager and Operator of the National Renewable Energy Laboratory.

BACKGROUND OF THE INVENTION

Photovoltaic devices that use $Cu(In, Ga)Se_2$ (CIGS) as an absorber layer have improved in recent years, and have the potential to achieve even higher efficiencies. One related art method of forming CIGS films involves sputtering metals from Cu, Ga, and In targets, and converting these precursors into CIGS films by reacting them with Se vapor or $H_2Se/H_2S$. However, as shown in FIG. 1, this method produces a CIGS absorber layer with a steep Ga gradient having low levels of Ga at the front of the CIGS absorber layer, which causes a low bandgap and a low open-circuit voltage ($V_{oc}$). Further, as shown by the cross-sectional scanning electron microscopy (SEM) image of the CIGS absorber layer in FIG. 2, this absorber layer suffers from a poor microstructure having voids, as well as problematic back contacts. Despite efforts to homogenize the Ga distribution within the absorber layer, the efficiency of the resulting photovoltaic devices incorporating these CIGS films remains low.

SUMMARY OF THE INVENTION

Exemplary embodiments of the present invention provide methods for forming CIGS films. According to an aspect of the present invention, a method of forming a CIGS film includes a precursor step including simultaneously evaporating Cu, In, Ga, Se, and Sb onto a substrate, wherein the Se is incident on the substrate at a rate of at least 20 Å/s; and a selenization step including evaporating Se over the substrate after the precursor step.

The precursor step may also include maintaining the substrate at a first temperature during a first time period. The selenization step may also include maintaining the substrate at a second temperature that is higher than the first temperature during a second time period; and subsequently maintaining the substrate at a third temperature that is higher than the second temperature during a third time period. The selenization step may also include, after the third time period, stopping the evaporation of the Se when the temperature of the substrate falls below a fourth temperature that is lower than the second temperature.

A ratio of Cu/(In+Ga) deposited onto the substrate during the precursor step may be between 0.75 and 1. A ratio of Ga/(In+Ga) deposited onto the substrate during the precursor step may be approximately 0.33 or approximately 0.5. A ratio of Sb/(Cu+In+Ga) deposited onto the substrate during the precursor step may be between 0.01 and 0.04. A ratio of Se/(Cu+In+Ga) deposited onto the substrate during the precursor step may be between 0.88 and 1.8.

The Se may be incident on the substrate at a rate of approximately 30 Å/s during the selenization step. The Sb may be incident on the substrate at a rate of at least 0.2 Å/s during the precursor step. The first temperature may be below approximately 350° C. The third temperature may be between approximately 400° C. and approximately 610° C., or between approximately 470° C. and approximately 610° C. The precursor step may further include stepping fluxes of the Ga and the In to produce a gradient of the Ga in the film.

Other objects, advantages, and novel features of the present invention will become apparent from the following detailed description of the invention when considered in conjunction with the accompanying drawings.

BRIEF DESCRIPTION OF THE DRAWINGS

FIGS. 5(a)-5(f) show cross-sectional SEM images of additional CIGS films formed by exemplary embodiments of the present invention;

FIGS. 6(a)-6(g) show cross-sectional SEM images of additional CIGS films formed by exemplary embodiments of the present invention;

FIGS. 12(a)-12(d) show quantum efficiency (QE) and photoluminescence (PL) data for the CIGS films shown in FIGS. 11(a)-11(d), respectively;

FIGS. 19(a)-19(e) show cross-sectional SEM images of CIGS film produced at different maximum substrate temperatures during the selenization step;

FIGS. 23(a)-23(c) show secondary ion mass spectrometry (SIMS) depth profiles of three of the CIGS films formed by exemplary embodiments of the present invention.

DETAILED DESCRIPTION OF EXEMPLARY EMBODIMENTS

Exemplary embodiments of the present invention provide methods of forming CIGS films. The method begins with a precursor step, in which Cu, In, Ga, Se, and Sb are simultaneously evaporated onto a substrate. For example, the elements may be evaporated from tungsten boats. The substrate may be made of any suitable material, such as glass, metal foil, or a polyimide sheet, and may be coated with a back contact material, such as Mo. During the precursor step, the substrate may be maintained at a first temperature during a first time period. For example, the substrate may be maintained below approximately 350° C. while the precursors are deposited onto the substrate. After the precursor step, a selenization step is performed to produce a CIGS film. During the selenization step, elemental Se is evaporated over the substrate onto which the precursors have been deposited. In some exemplary embodiments of the present invention, the Sb may incorporated into the CIGS film as a dopant.

Figure 1:
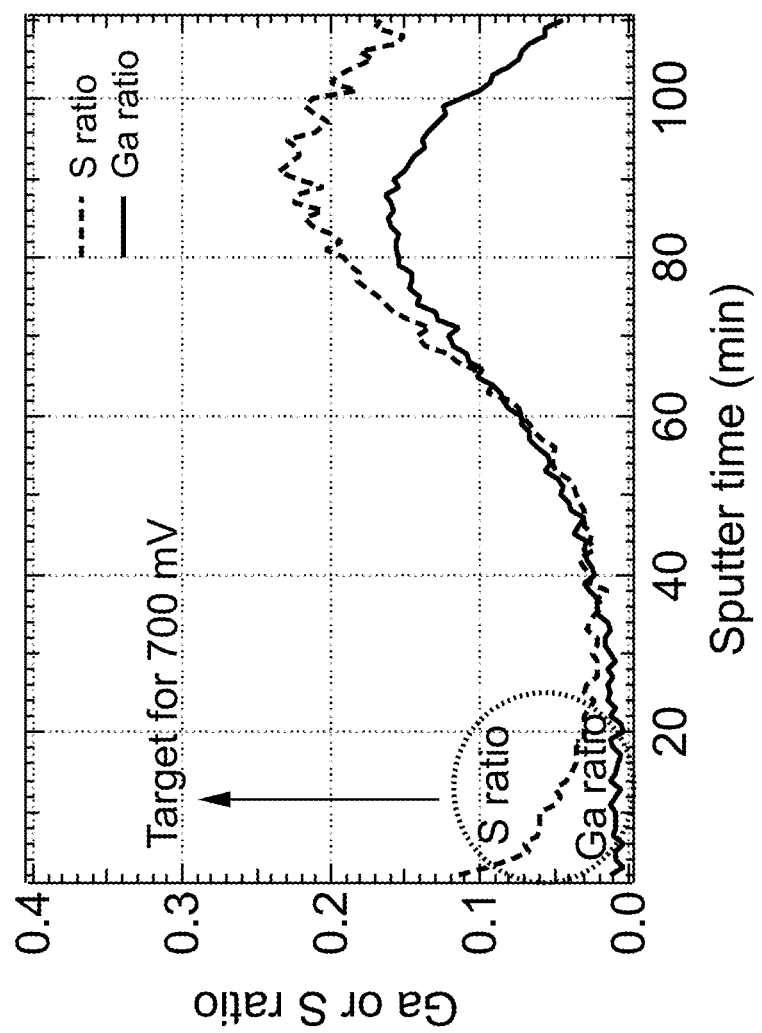
FIG. 1 shows a depth profile of a CIGS film formed by a related art method.
Figure 2:
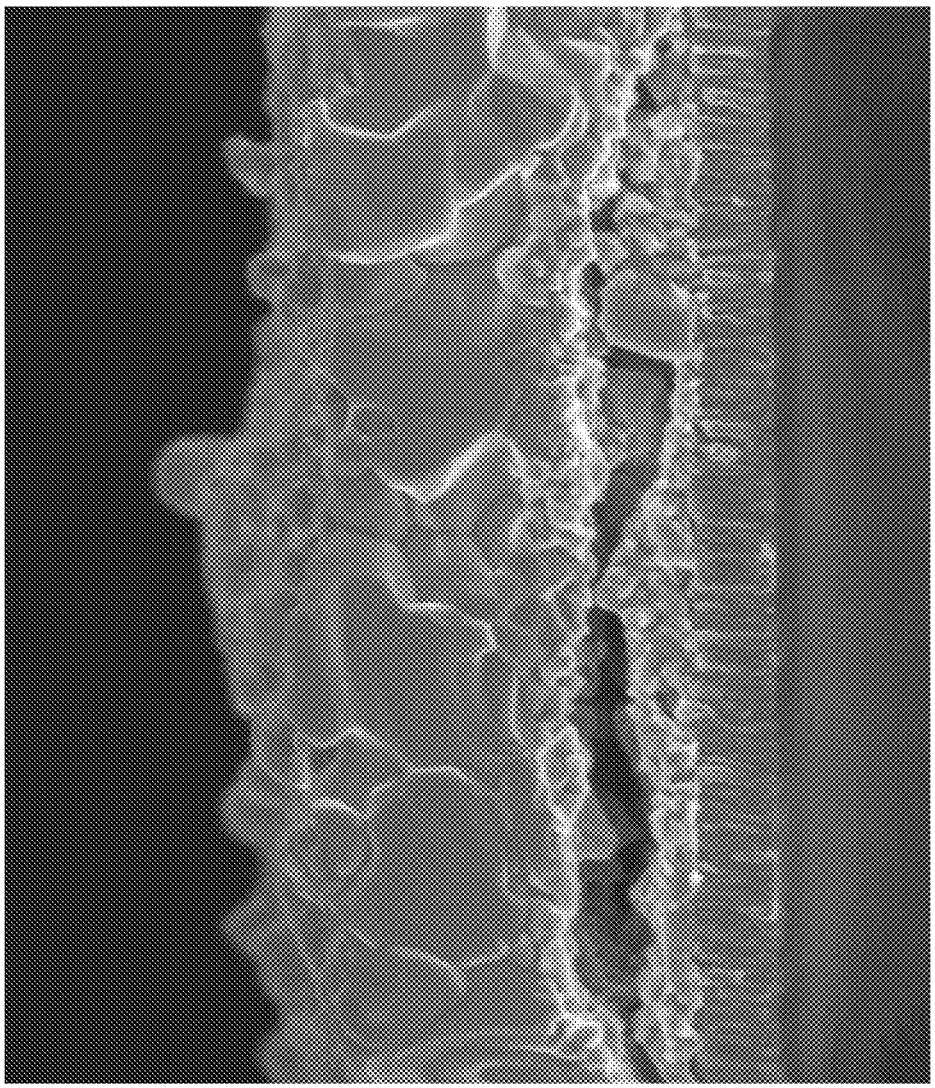
FIG. 2 shows a cross-sectional SEM image of a CIGS film formed by a related art method.
Figure 3:
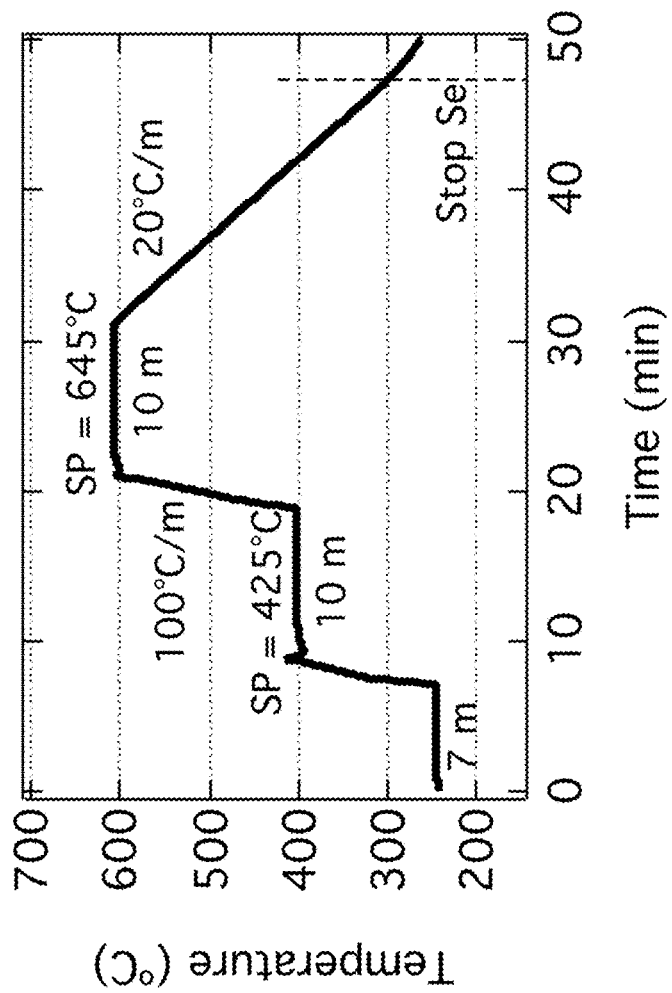
FIG. 3 shows a temperature profile that may be used to form a CIGS film according to exemplary embodiments of the present invention.

FIG. 3 shows an example of a temperature profile that may be used to form a CIGS film according to exemplary embodiments of the present invention. Although specific values are provided for the durations of the intervals shown in FIG. 3, any suitable values may be used for these durations. In the example shown in FIG. 3, the substrate may be maintained at a first temperature of approximately 240° C. during a precursor step that lasts for 7 minutes. Once the selenization step begins, the substrate temperature may be increased to a second temperature of approximately 400° C. by increasing the set point temperature to 425° C. After holding the substrate temperature at approximately 400° C. for 10 minutes, the substrate temperature may then be increased to a third temperature of approximately 600° C. by increasing the set point temperature to approximately 645° C. In this example the set point temperature is offset from the substrate temperature, which is measured on the back side of the substrate glass with a thermocouple. After holding the substrate temperature at approximately 600° C. for 10 minutes, the substrate may be allowed to cool. Once the substrate temperature falls to approximately 300° C., the Se flux may be stopped.

CIGS films formed by the method described above may be used as an absorber layer in a photovoltaic device. The photovoltaic device may be formed by any suitable method, such as those disclosed in M. A. Contreras, B. Egaas, K. Ramanathan, J. Hiltner, A. Swartzlander, F. Hasoon, and R. Noufi, "Progress toward 20% efficiency in Cu(In,Ga)Se$_2$ polycrystalline thin-film solar cells," Prog. Photovoltaics Res. Appl., vol. 7, pp. 311-316, 1999 and M. A. Contreras, M. J. Romero, B. To, F. Hasoon, R. Noufi, S. Ward, and K. Ramanathan, "Optimization of CBD CdS process in high-efficiency Cu(In,Ga)Se$_2$-based solar cells," Thin Solid Films, vol. 403, pp. 204-211, 2002, the entire disclosures of which are hereby incorporated by reference in their entireties. For example, the CIGS films may be used to form photovoltaic devices by adding a buffer layer, ZnO, and metal grids.

In exemplary embodiments of the present invention, various precursor parameters may be adjusted to promote recrystallization, enhance crystal quality, and/or homogenize the Ga distribution through the CIGS film. Table I lists the precursor parameters for 12 runs in which the above-described method was performed. JMP® statistical software was used in this example to perform a Design of Experiments (DoE) to determine the precursor parameters used in the precursor step for runs 3-12. This example used the "Custom Design" option in the JMP® statistical software. First the responses to be measured were entered into the program. In this example, the responses to be measured were device parameters, including the open-circuit voltage ($V_{oc}$), the short-circuit current ($J_{sc}$), the fill factor (FF), and the efficiency of the photovoltaic device incorporating the CIGS film. For each response, goals and limits may also be entered into the program. In this example, $V_{oc}$, FF, and efficiency are maximized while $J_{sc}$ is minimized.

TABLE I

CIGS Precursor Parameters

| Run | Se Rate (Å/s) | Set Point Temp (° C.) | Sb Rate (Å/s) |
|---|---|---|---|
| 1 | 20 | 240 | 0.5 |
| 2 | 20 | 240 | 0 |
| 3 | 40 | 250 | 0.6 |
| 4 | 0 | 150 | 1 |
| 5 | 20 | 350 | 0.2 |
| 6 | 40 | 150 | 1 |
| 7 | 40 | 350 | 1 |
| 8 | 20 | 250 | 1 |
| 9 | 18.4 | 152 | 0.6 |
| 10 | 5 | 250 | 0.2 |
| 11 | 5 | 350 | 0.6 |
| 12 | 40 | 150 | 0.2 |

Parameters for the precursor formation may be identified as the most likely to be responsible for changes in properties of the final film. In this example, the precursor parameters were the Se flux rate, the substrate temperature, and the Sb flux rate during the precursor step. For each precursor parameter, lower and upper limits were included based on system constraints and prior knowledge of CIGS processing. The user may decide if only the main effects should be investigated, or if two-factor interactions should also be included in the design. The JMP® statistical software then takes the input information and determines the smallest number of runs that will allow statistical predictions.

The amounts and/or fluxes of at least some of the precursor materials provided during the precursor step may be determined by targeted ratios of the precursor materials to be deposited onto the substrate during formation of the CIGS film. In this example, the targeted ratio of Cu/(In+Ga) was 0.86 and the targeted ratio of Ga/(In+Ga) was 0.33, because these ratios have previously produced CIGS absorber layers for high-efficiency solar cells. However, any suitable targeted ratios may be used. For example, the targeted ratio of Cu/(In+Ga) may be between 0.75 and 1; a targeted ratio of Sb/(Cu+In+Ga) may be between 0.01 and 0.04; and/or a targeted ratio of Se/(Cu+In+Ga) may be between 0.88 and 1.8. The targeted ratio of Ga/(In +Ga) may be between 0 and 1.0. If the targeted ratio of Ga/(In+Ga) is 0, a CuInSe$_2$ (CIS) film is formed as a variant of a CIGS film. In this modification, Ga is omitted from the precursor step.

Figures 4A, 4B, 4C:
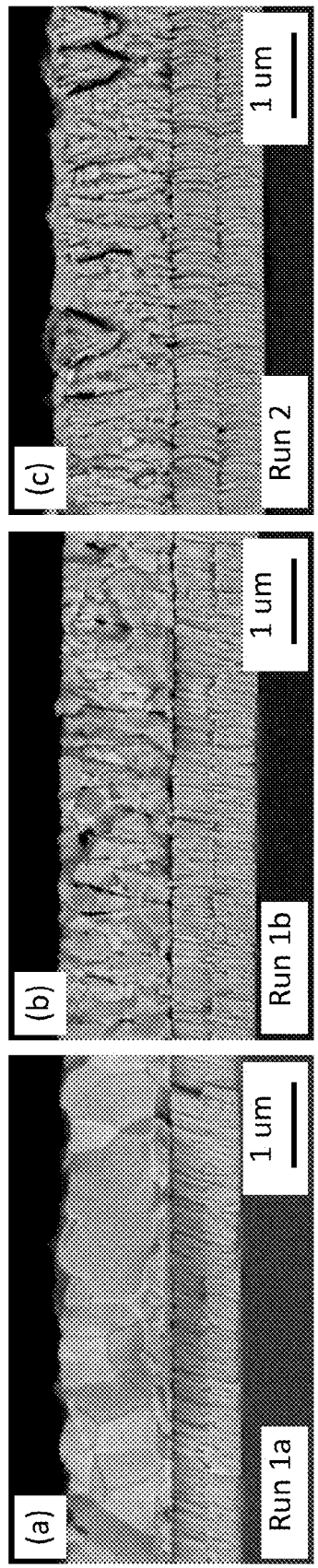
FIGS. 4(a)-4(c) show cross-sectional SEM images of CIGS films formed by exemplary embodiments of the present invention.

A series of CIGS films was formed by using the precursor parameters shown in Table I during the precursor step. In this example, the Se was incident on the substrate at a rate of approximately 30 Å/s during the selenization step. Cross-sectional scanning electron microscopy (SEM) was performed on each film. FIG. 4(a) shows a cross-sectional SEM image for a large-grain region of the film produced in run 1, FIG. 4(b) shows a cross-sectional SEM image for a small-grain region of the film produced in run 1, and FIG. 4(c) shows a cross-sectional SEM image of the film produced in run 2. The Se flux rate and the substrate temperature were the same for runs 1 and 2; however, run 1 included Sb in the precursor step, while run 2 did not include Sb in the precursor step. As shown in FIGS. 4(a) and 4(b), the film produced in run 1 has two distinct regions. FIG. 4(a) shows that one region of the film has large grain morphology (and better device results, as discussed below) than the other region of the film shown in FIG. 4(b). As shown in FIG. 4(c), the film produced in run 2 has slight spatial differences as compared to the film produced in run 1. However, there were no areas with the large grains in the film produced in run 2. Therefore, in order to produce a CIGS film with increased grain size, Sb is simultaneously evaporated with Cu, In, Ga, and Se during the precursor step according to exemplary embodiments of the present invention.

With regard to runs 3-12, whose precursor parameters were determined by the Design of Experiments, three of the runs showed morphology variations across a single substrate. FIGS. 5(a)-5(f) show cross-sectional SEM images of the films that illustrate the variations. Cross-sectional SEM images of films produced in run 5 are shown in FIGS. 5(a) and 5(b), cross-sectional SEM images of films produced in run 8 are shown in FIGS. 5(c) and 5(d), and cross-sectional SEM images of films produced in run 9 are shown in FIGS. 5(e) and 5(f). The images shown in FIGS. 5(a), 5(c), and 5(e) are from the side of the film that saw a slightly lower Sb flux and a slightly higher Se flux.

For example, the film produced in run 5 has larger grains and fewer small voids in the portion of the film shown in FIG. 5(a) than the portion of the film shown in FIG. 5(b). A similar trend is observed for the film produced in run 8, which has larger grains in the portion shown in FIG. 5(c) and smaller grains in the portion shown in FIG. 5(d). The film produced in run 9 is unusual because the smallest grains are observed in the portion shown in FIG. 5(e), and there is some evidence of a two-layered structure in the portion shown in FIG. 5(f). In these images, the top row is taken from the side of the films that see slightly less Sb flux and slightly higher Se flux. These results suggest that there is an interaction between the Sb flux and the Se flux during the precursor step. Further, it appears that only a small amount of Sb is necessary to induce morphology changes in the final CIGS films.

Figure 6D:
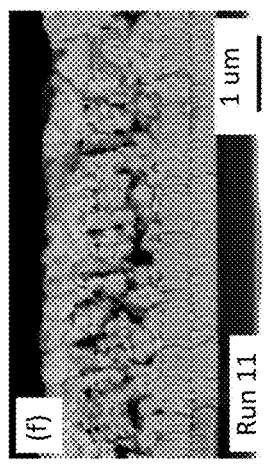
Figure 6E:
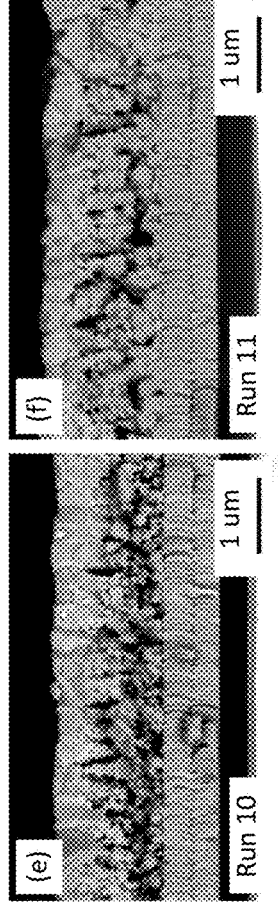
Figure 6F:
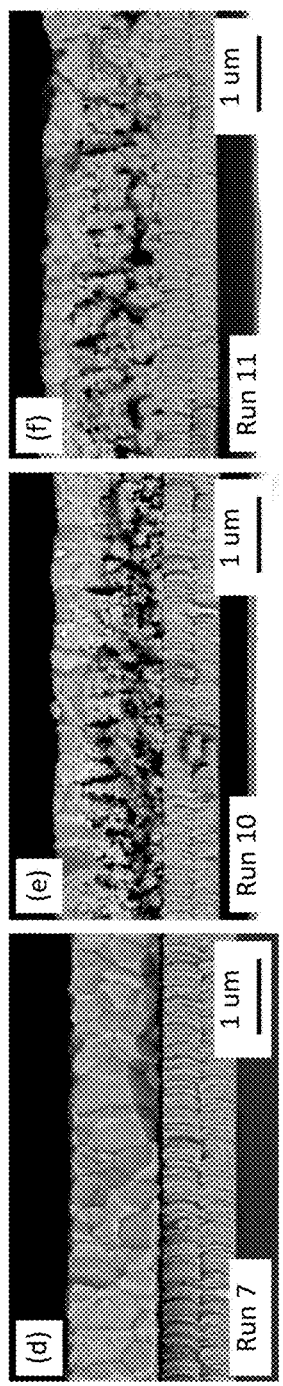
Figure 6G:
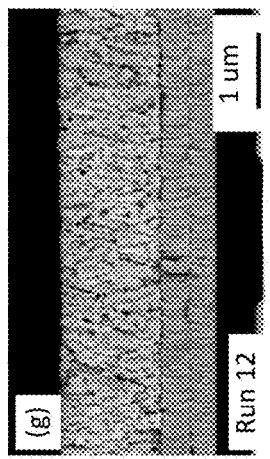

Each of the films produced by the remaining runs was relatively uniform across the substrate. As shown in FIGS. 6(a)-6(g), the films varied greatly in grain size, voids, and two-layered structure. These differences are dependent on the precursor parameters used in each run and listed in Table I. FIG. 6(a) shows a cross-sectional SEM image for the film produced in run 3, FIG. 6(b) shows a cross-sectional SEM image for the film produced in run 4, FIG. 6(c) shows a cross-sectional SEM image for the film produced in run 6, FIG. 6(d) shows a cross-sectional SEM image for the film produced in run 7, FIG. 6(e) shows a cross-sectional SEM image for the film produced in run 10, FIG. 6(f) shows a cross-sectional SEM image for the film produced in run 11, and FIG. 6(g) shows a cross-sectional SEM image for the film produced in run 12.

The film produced in run 3 and shown in FIG. 6(a), and the film produced in run 7 and shown in FIG. 6(d), display the best grain morphology. These films have larger grain sizes, few voids between the grains, and few voids at the CIGS/back contact interface. In contrast, the film produced in run 4 and shown and FIG. 6(b), the film produced in run 10 and shown in FIG. 6(e), and the film produced in run 11 and shown in FIG. 6(f) have the least desirable film morphologies, because they appear to have large voids that could cause delamination of the film or poor device performance. As shown in Table I, these films were made with low Se flux in the precursor step. Therefore, a minimum flux of Se in the precursor is advantageous to prevent void formation in the films. Specifically, it is advantageous for the Se to be incident on the substrate at a rate of at least 20 Å/s during the precursor step.

Both run 6 shown in FIG. 6(c) and run 12 shown in FIG. 6(g) used high values for the Se flux and low values for the substrate temperature. The film produced in run 12 has extremely small grains; therefore, it is unlikely that good solar cell devices could be produced from this film. The film produced in run 6 has slightly larger grains, but voids exist throughout the film. These results show that the Sb flux has a substantial effect on the grain size. It appears that in order to increase the grain size, a higher Sb flux is needed at low substrate temperatures.

Current density voltage measurements were performed on the photovoltaic devices at 25° C. and 1 sun conditions to determine the device parameters, including the efficiency, $V_{oc}$, $J_{sc}$, and FF. The results are shown in Table II. The film produced in run 7 peeled during device processing, resulting in the lack of data for run 7 in Table II. Because the film produced in run 7 did not adhere well to the substrate, it may not be advantageous to use the combination of precursor parameters corresponding to run 7.

TABLE II

Best Device Parameters

| Run | Efficiency (%) | $V_{oc}$ (V) | $J_{sc}$ (mA/cm$^2$) | FF (%) |
|---|---|---|---|---|
| 1 | 14.4 | 0.633 | −30.4 | 74.7 |
| 2 | 12.3 | 0.607 | −27.2 | 74.4 |
| 3 | 13.9 | 0.634 | −29.2 | 75.0 |
| 4 | 11.8 | 0.489 | −34.6 | 69.6 |
| 5 | 14.9 | 0.642 | −29.6 | 78.3 |
| 6 | 14.6 | 0.646 | −29.9 | 75.3 |
| 7 | 0 | 0 | 0 | 0 |
| 8 | 14.0 | 0.626 | −30.0 | 74.6 |
| 9 | 11.8 | 0.598 | −26.8 | 73.8 |
| 10 | 9.8 | 0.482 | −30.5 | 66.9 |
| 11 | 7.4 | 0.384 | −31.6 | 60.7 |
| 12 | 10.4 | 0.590 | −25.2 | 70.4 |

As shown in Table II, photovoltaic devices fabricated with CIGS films produced in runs 1, 5, 6, and 8 had the highest efficiencies of at least 14%. The Design of Experiments was then run to determine the importance of each factor (precursor parameter or combination of precursor parameters). The results are shown in Table III. A factor labeled as "significant" has a greater effect on a device parameter than a factor labeled as "important." The difference is quantified by a probability that the true value of the factor's effect is 0. If the probability is less than 0.0100, then the factor is labeled as "significant." If the probability is between 0.0100 and 0.0500, then the factor is labeled as "important."

TABLE III

Importance of Precursor Factors on Device Parameters

| Factors | Efficiency | $V_{oc}$ | $J_{sc}$ | FF |
|---|---|---|---|---|
| Step 1 Temp*Sb Flux | Significant | Important | Significant | Important |
| Step 1 Temp | Important | Important | Important | |
| Se Rate*Sb Flux | Important | | Important | |
| Se Rate(0, 40) | Important | | Important | |
| Se Rate*Step 1 Temp | | | | Significant |

The factors are listed in order of the importance of their effect on the device parameters. The interaction between the substrate temperature and the Sb flux during the precursor step is the top interaction on the list, because it is significant for the $J_{sc}$ and the efficiency, and is also important for the $V_{on}$ and the FF. The interaction between the substrate temperature and the Sb flux has the strongest effect on the device, because all of the device parameters are affected by this interaction. Accordingly, when the substrate temperature and the Sb flux are chosen to have optimum values, there should be a wider window of Se fluxes that will produce good devices. The other factors shown in Table III may have less of an effect on device performance, but can still be adjusted to achieve specific desired results. For example, the interaction between the Se flux and the substrate temperature has a significant effect on the $J_{sc}$.

Figure 7:
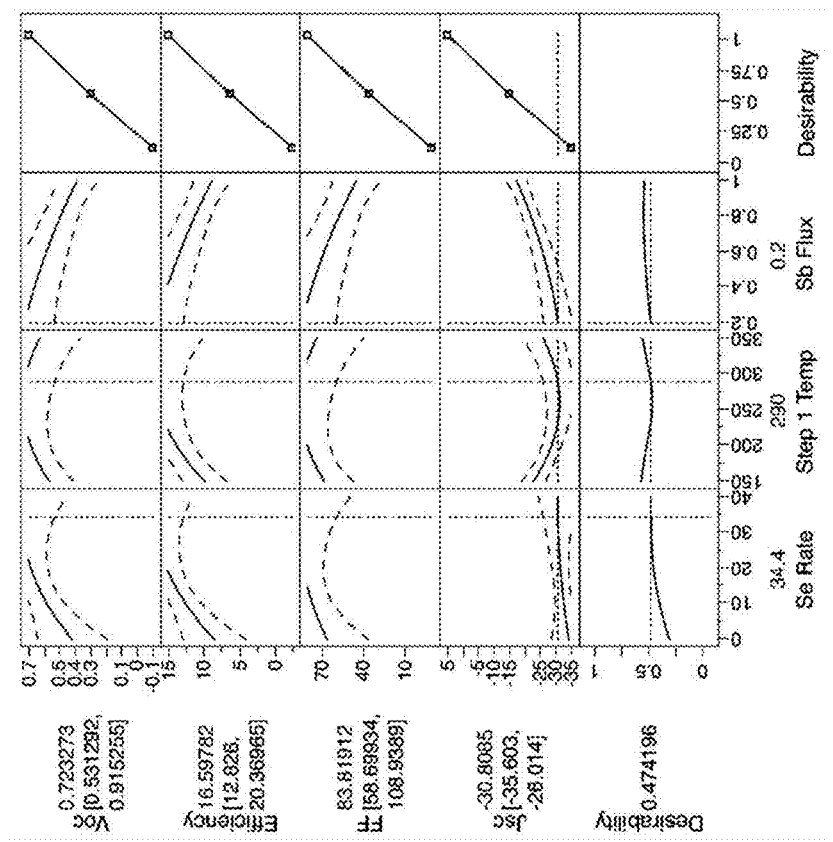
FIG. 7 shows an example of a prediction profiler that may be used to adjust the precursor parameters according to exemplary embodiments of the present invention.

The efficiency of the devices may be further improved by adjusting the precursor parameters shown in Table I. This may be achieved by using a prediction profiler, an example of which is shown in FIG. 7 to maximize efficiency for a low Sb flux. The prediction profiler plots the 4 device parameters along the vertical axis and the three precursor parameters along the horizontal axis. Each of the 12 graphs shown in the upper left-hand portion of FIG. 7 shows how these values relate to each other. In the prediction profiler, the vertical dotted line can be moved horizontally in any of the graphs to change the level of a precursor parameter. For example, the Se rate can be moved from 20 Å/s to 28 Å/s (holding the substrate temperature and the Sb flux constant) to see how adjusting the Se rate affects the device parameters.

In FIG. 7, the numerical values at the top of each section indicate the selected values for the precursor parameters (horizontal axis) and the corresponding predicted values for the device parameters (vertical axis). The numerical values between the brackets indicate the range within the device parameters should fall, which is a 95% confidence interval in this example. The solid lines correspond to the predicted values for the device parameters, and the dashed lines indicate the uncertainty or error bars. The various precursor parameters may be adjusted to achieve the optimum values for the various device parameters. The desirability may also be set for each precursor parameter and each device parameter. In this example, the desirabilities of the efficiency, $V_{oc}$, and FF are set to the maximum values, so that these parameters are as high as possible. Because $J_{sc}$ is negative, its desirability is set to a minimum value. The desirability graphs along the bottom of FIG. 7 illustrate how further adjustment of each precursor parameter influences the overall desirability.

Table IV shows the precursor parameters and device results for additional CIGS films produced during runs that were designed to increase the efficiency of the device. For example, by using the precursor parameters of an Se flux of 34.4 Å/s, a substrate temperature of 290° C., and an Sb flux of 0.2 Å/s during the precursor step, the efficiency of the device was increased from 14.9% in run 5 (the highest efficiency in Table II) to 15.5% in run 13, due to increases in the $V_{oc}$ and the $J_{sc}$.

TABLE IV

Best Device Parameters for Follow-up Runs

| Run | Se Rate (Å/s) | Set Point Temp (° C.) | Sb Rate (Å/s) | Efficiency (%) | $V_{oc}$ (V) | $J_{sc}$ (mA/cm$^2$) | FF (%) |
|---|---|---|---|---|---|---|---|
| 13 | 34.4 | 290 | 0.2 | 15.5 | 0.662 | −30.4 | 77.2 |
| 14 | 24.8 | 158 | 1 | 12.8 | 0.552 | −31.6 | 73.4 |
| 15 AR | 34.4 | 290 | 0.2 | 16.9 | 0.668 | −33.8 | 74.8 |

The Ga gradient in the films produced in the examples discussed above was also measured. For runs with a Se flux of at least 20 Å/s during the precursor step, the Ga gradient was approximately flat. Because Se is included in the precursor step, the Ga and In do not move in order to react with Se. In contrast, when the Se flux is less than 5 Å/s in the precursor step, the final films have less Ga at the surface and more Ga near the back contact of the film.

Figure 8:
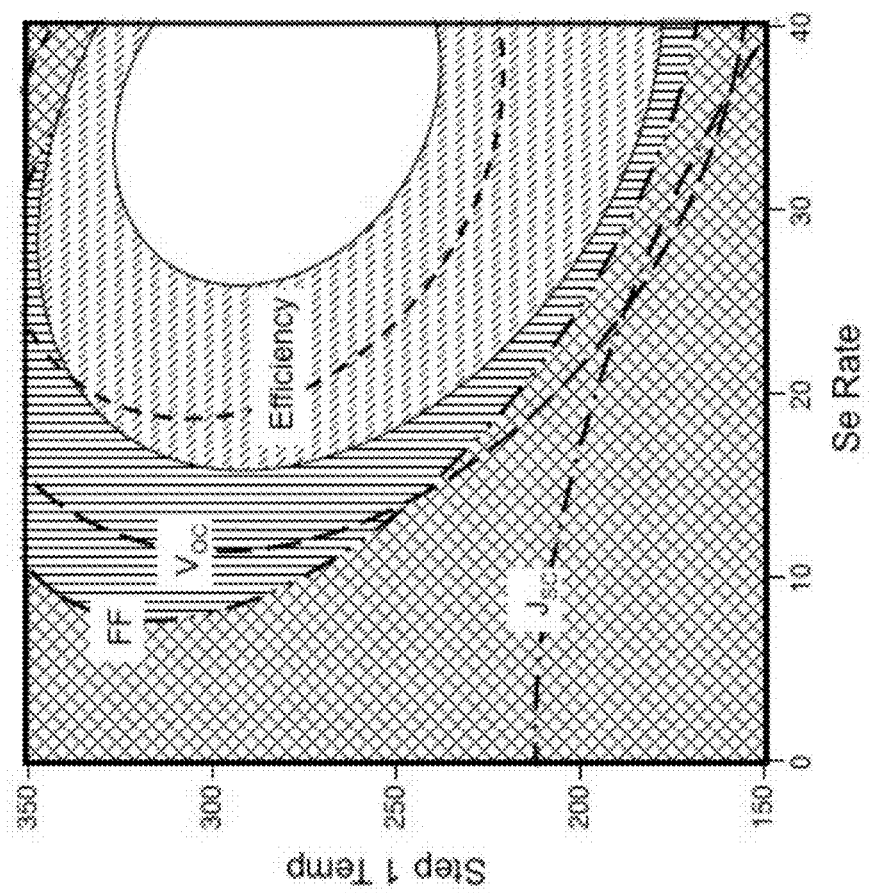
FIG. 8 shows the results of using a prediction profiler with an Sb flux rate of 0.2 Å/s.
Figure 9:
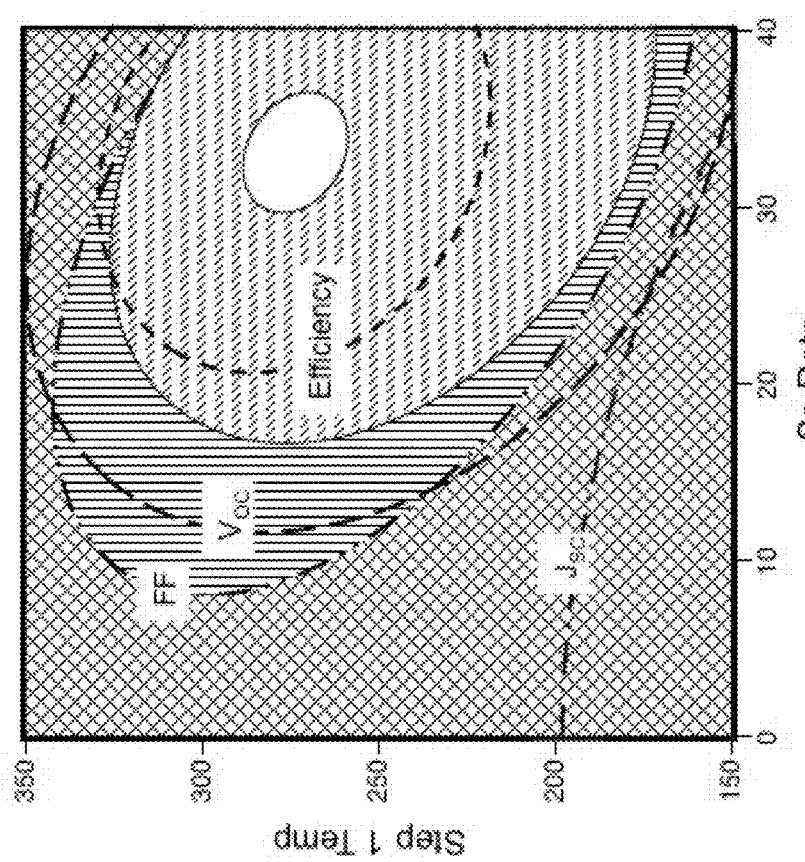
FIG. 9 shows the results of using the prediction profiler with an Sb flux rate of 0.3 Å/s.
Figure 10:
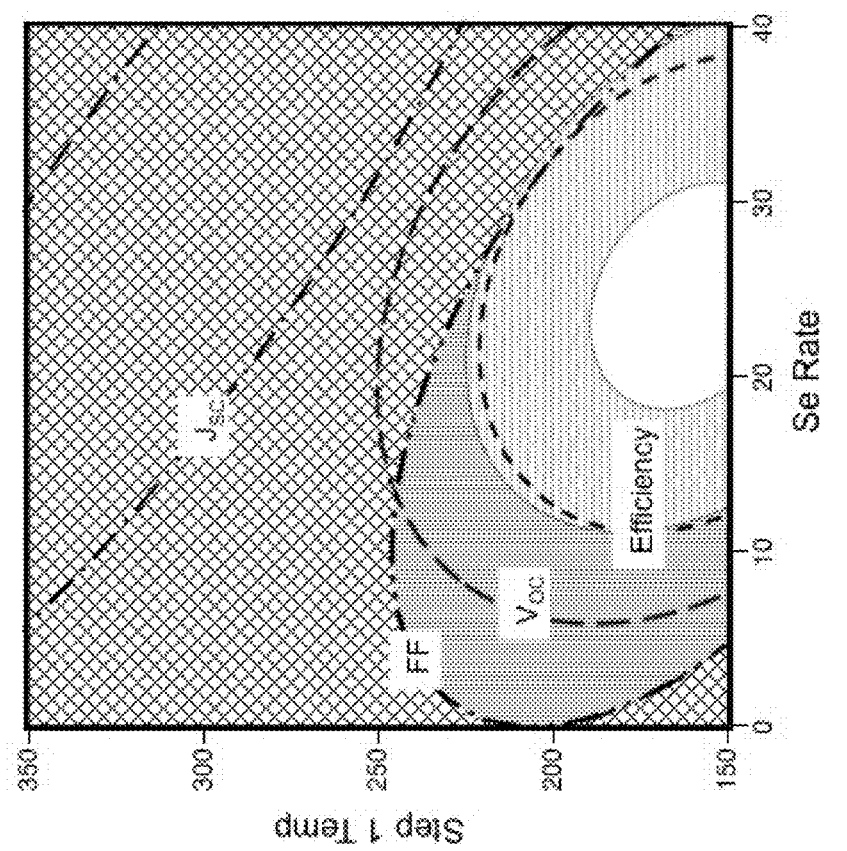
FIG. 10 shows the results of using the prediction profiler with an Sb flux rate of 1.0 Å/s.

Various methods may be used to determine the acceptable and/or optimal ranges for the precursor parameters. In one example, the prediction profiler was used to set the Sb flux, adjust the Se flux to give a predicted efficiency of at least 16%, and adjust the substrate temperature to identify a suitable range of substrate temperatures. Examples of three results are shown in FIGS. 8-10. In FIG. 8, the Sb flux was set to 0.2 Å/s; in FIG. 9, the Sb flux was set to 0.3 Å/s; and in FIG. 10, the Sb flux was set to 1.0 Å/s.

In FIGS. 8-10, the white region indicates the range of combinations of Se flux and substrate temperatures that yield an efficiency of at least 15.95%. The diagonal dashed region indicates the range of combinations of Se flux and substrate temperatures that yield an efficiency below 15.95%, and the line labeled "Efficiency" indicates the combinations of Se flux and substrate temperatures that yield an efficiency of 15%. The cross-hatched region indicates the range of combinations of Se flux and substrate temperatures that yield a FF below 75%, and the line labeled "FF" indicates the combinations of Se flux and substrate temperatures that yield a FF of 75%. The vertical striped region indicates the range of combinations of Se flux and substrate temperatures that yield a $V_{oc}$ below 0.65 V, and the line labeled "$V_{oc}$" indicates the combinations of Se flux and substrate temperatures that yield a $V_{oc}$ of 0.6 V.

FIG. 8 shows that in order to achieve an efficiency of at least 16% with an Sb flux of 0.2 Å/s, the Se flux should be greater than approximately 25 Å/s and the set point temperature should be between approximately 288° C. and 310° C., resulting in a substrate temperature between approximately 279° C. and 299° C. FIG. 9 shows that in order to achieve an efficiency of at least 16% with an Sb flux of 0.3 Å/s, the Se flux should be greater than approximately 30 Å/s and the set point temperature should be between approximately 274° C. and 288° C., resulting in a substrate temperature between approximately 266° C. and 279° C. FIG. 10 shows that in order to achieve an efficiency of at least 16% with an Sb flux of 1.0 Å/s, the Se flux should be between approximately 19 Å/s and 30 Å/s and the set point temperature should be between approximately 150° C. and 183° C., resulting in a substrate temperature between approximately 155° C. and 185° C.

Optoelectronic characterization may be used to evaluate the electronic properties of photovoltaic materials and devices. Such optoelectronic characterization was performed on the CIGS films and photovoltaic devices formed by the methods discussed above. Both room-temperature and low-temperature photoluminescence (PL) emission spectra of CIGS films coated with CdS were measured using laser excitation at 632.8 nm. Time-resolved photoluminescence (TRPL) decays were measured. Excitation was at 640 nm, and all PL was spectrally integrated. The average excitation power was 0.05 mW, or $7.5 \times 10^{10}$ photons/($cm^2$pulse). This corresponds to an initial carrier concentration of $2.8 \times 10^{15}$ $cm^{-3}$. TRPL decays were essentially identical when higher excitation power (0.12 mW) was used, which suggests low injection in TRPL measurements.

Current density-voltage (J-V) measurements were performed on the solar cells under standard AM1.5 conditions at 25° C. One solar cell from each sample piece was also tested with external quantum efficiency (QE) measurements at room temperature. Admittance spectroscopy (AS) measurements were conducted using an Agilent 4294A impedance analyzer. The AC modulation voltage was nominally 35 mVrms. A temperature controller was used to stabilize and sense the cold-finger temperature (ranging from 14-400 K) of a closed-loop He cryostat. At each temperature setting, the sample temperature was recorded from a second temperature sensor attached directly to the sample side of the substrate. A logarithmic frequency scan was carried out from 1 to 1000 kHz. Capacitance-voltage (CV) measurements were also performed. $N_{CV}$ at 0V was $3.9 \times 10^{16}$ $cm^{-3}$ for sample 2A and $1.2 \times 10^{16}$ $cm^{-3}$ for sample 2B.

Table V lists the device parameters of the best solar cell on each sample in this example. Sample 1 was the control sample, with no Sb included in the precursor. Sample 2 contained Sb in the precursor and displayed a variation in device performance from one side of the sample to the other. The Sb amount was increased for sample 3, and the device parameters were more uniform across the entire sample. All of the samples with Sb showed an increase in $V_{oc}$ compared to the control sample, even though the bandgap calculated from the QE was the same. Samples 2B and 3 also had an increased $J_{sc}$ compared with samples 1 and 2A. The increases in $J_{sc}$ and $V_{oc}$ of the solar cells made from Sb-containing precursors increased the device efficiency.

TABLE V

Sample Description and Solar Cell Parameters

| Sample | Notes | Efficiency (%) | $V_{oc}$ (V) | $J_{sc}$ (mA/cm²) | FF (%) | QE Effective Bandgap (eV) | RT PL PEAK (eV) |
|---|---|---|---|---|---|---|---|
| 1 | No Sb | 12.3 | 0.607 | 27.2 | 74.4 | 1.14 | 1.18 |
| 2A | Sb, small grains | 12.6 | 0.633 | 27.0 | 73.8 | 1.14 | 1.15 |
| 2B | Sb, large grains | 14.4 | 0.633 | 30.4 | 74.7 | 1.14 | 1.15 |
| 3 | Sb increased | 14.6 | 0.646 | 29.9 | 75.3 | 1.14 | 1.14 |

Figure 11B:
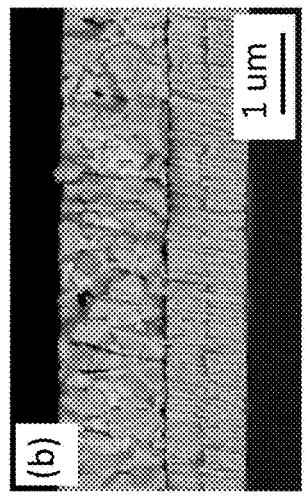
FIGS. 11(a)-11(d) show cross-sectional SEM images of additional CIGS films formed by exemplary embodiments of the present invention.
Figure 11D:
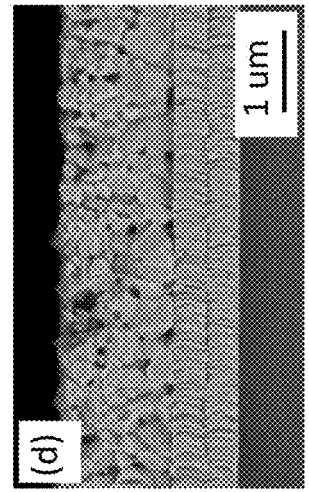
Figure 11A:
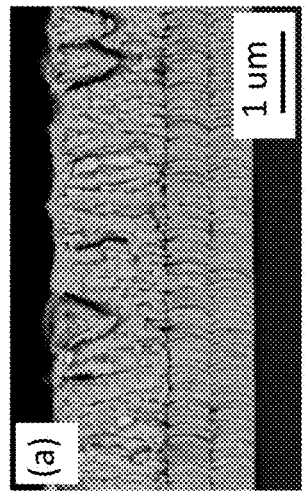
Figure 11C:
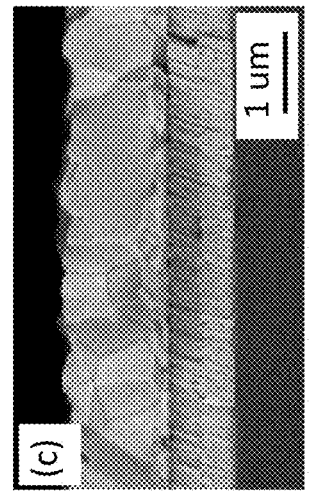

FIGS. 11(a)-11(d) show the results of a cross-sectional SEM investigation of the samples. FIG. 11(a) shows a cross-sectional SEM image of sample 1, FIG. 11(b) shows a cross-sectional SEM image of sample 2A, FIG. 11(c) shows a cross-sectional SEM image of sample 2B, and FIG. 11(d) shows a cross-sectional SEM image of sample 3. As shown in FIG. 11(a), sample 1, the control sample, had small grain sizes and appeared to be of poor crystalline quality. Sample 2, the Sb-containing sample with large variations in device efficiency, also showed a variation in grain size. As shown in FIGS. 11(b) and 11(c) respectively, one side had small grains whereas the other side had large grains. As shown in FIG. 11(d), sample 3 was an unusual film with larger grains toward the back contact, smaller grains near the surface, and many voids.

Figure 12C:
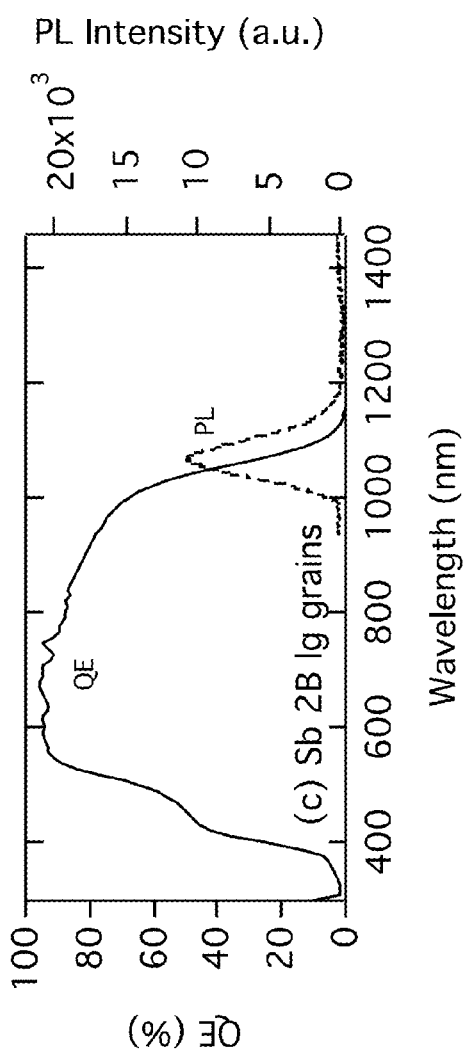
Figure 12D:
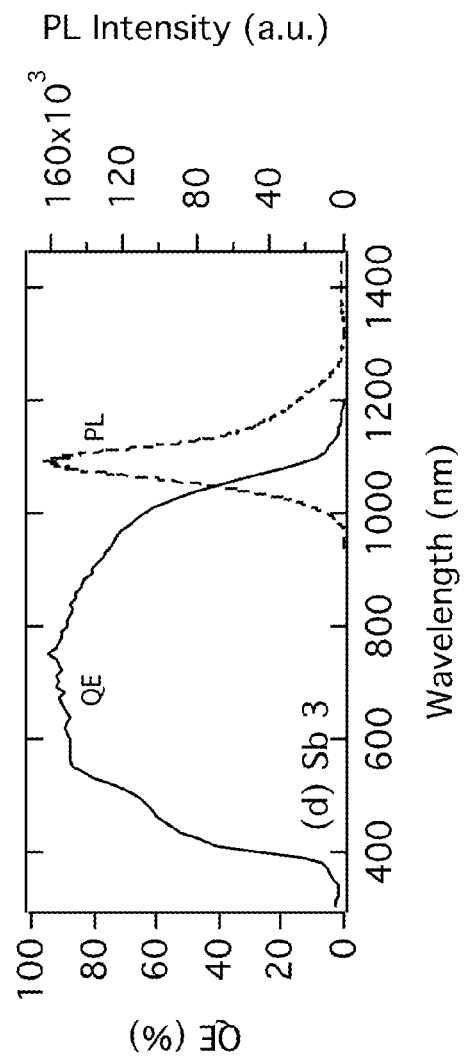

FIGS. 12(a)-12(d) show the QE data and room-temperature PL emission spectra for the samples shown in FIGS. 11(a)-11(d), respectively. The QE data are shown on the left-hand side of the figures, and the PL spectra are shown on the right-hand side of the figures. FIG. 12(a) shows the data for sample 1 with no Sb, FIG. 12(b) shows the data for sample 2A with Sb and small grains, FIG. 12(c) shows the data for sample 2B with Sb and large grains, and FIG. 12(d) shows the data for sample 3 with the highest amount of Sb. The scale of the PL spectrum is changed in FIG. 12(d).

Because CIGS is a highly compensated material with local deviations in the distribution of donors and acceptors, potential fluctuations may exist in the band structure. These appear as a slope in the long wavelength edge of the QE, which contrasts the steep band edge that exists, for example, in the QE of GaAs and CdTe solar cells. In addition, CIGS has a shallower slope in the long wavelength QE, typically between 1000 and 1150 nm, due to the variation in the Ga distribution throughout the film thickness causing variations in the band gap, $E_g$. In this example, the Ga content through the film thickness does not vary significantly, so $E_g$ variation should have less of an effect on the QE slope. Therefore, such films provide an interesting system to study potential fluctuations. The drop in QE in the 850-1050 nm wavelength region is most pronounced in FIGS. 12(a) and 12(b), whereas FIGS. 12(c) and 12(d) have higher QE in this region. The full width at half maximum (FWHM) of the room-temperature PL peaks (dashed lines) is also narrower for all of the samples whose precursors contained Sb. These two observations may imply that Sb doping reduces the delocalization of donor and acceptor states in CIGS films. Collection may also be increased in sample 2B due to the better crystallization, possibly causing a longer diffusion length.

In all four cases, the QE band edge overlaps well with the PL peak. The $E_g$ values calculated from QE are given in Table V. The PL peak shifted slightly and had different intensity depending on the sample. The high Sb sample has a higher-intensity PL peak and the scale of the right axis in FIG. 12(d) is nearly eight times higher than the others. The $E_g$ from QE was essentially the same for all samples.

Figure 13A:
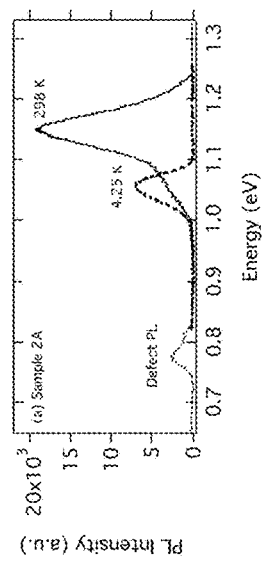
FIGS. 13(a)-13(c) show PL peaks for the CIGS films shown in FIGS. 11(b)-11(d), respectively.
Figure 13B:
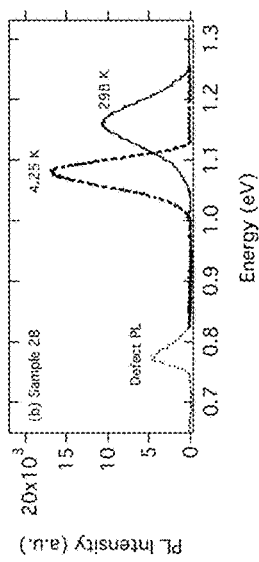
Figure 13C:
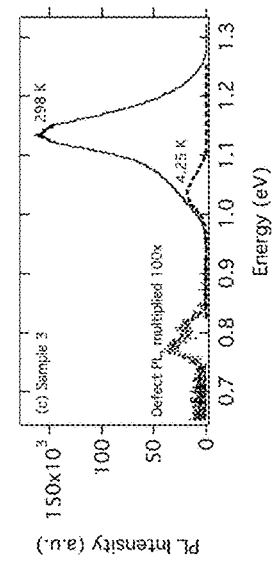

PL emission spectra for the samples formed with Sb are shown in FIGS. 13(a)-13(c). FIG. 13(a) shows the PL emission spectra for sample 2A, FIG. 13(b) shows the PL emission spectra for sample 2B, and FIG. 13(c) shows the PL emission spectra for sample 3. The scale of the PL spectra is changed in FIG. 13(c).

As shown in FIGS. 13(a)-13(c), the PL emission for sample 3 is much stronger than the other samples. The room-temperature (298K, solid line) PL emission peaks in FIGS. 13(a)-13(c) correspond to the transitions between the donor and acceptor bands, and, as mentioned above, correlate to the QE bandgap. The low-temperature (4.25 K, dashed line) PL emission spectra are shifted to lower energy and associated with band-tail transition. An even lower-energy emission (0.75-0.82 eV, dotted line) was observed at low temperature in these samples. This peak has the highest intensity for sample 2B. The defect peak in sample 3 is 90% lower than sample 2B, therefore it is multiplied by 100×, in order to show that the peak is in the same position as that for sample 2B.

Figure 14A:
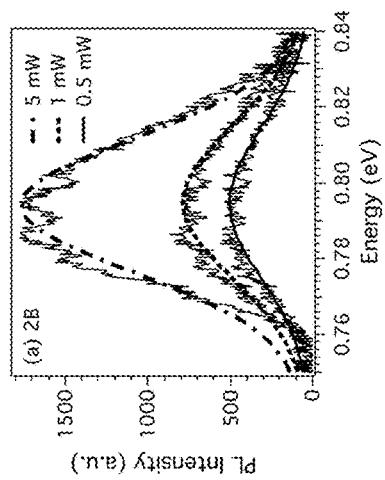
FIGS. 14(a) and 14(b) show the PL intensity as a function of energy at different excitation powers for the CIGS film shown in FIG. 11(b) and the PL intensity as a function of excitation power for the CIGS films shown in FIGS. 11(b)-11(d)
Figure 14B:
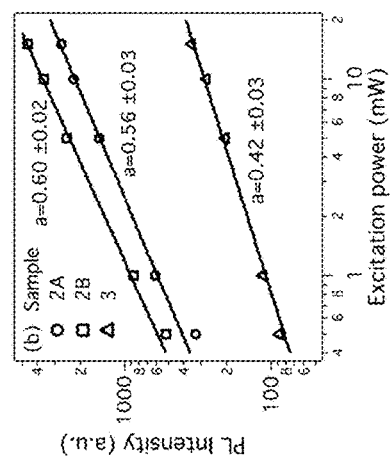

The low energy PL emission peak at ~0.79 eV is not typically seen in CIGS materials and may be related to Sb incorporation. Therefore, more detailed analysis was performed for this newly observed radiative transition. FIG. 14(a) shows the PL intensity as a function of energy for the defect peak at different excitation powers, and FIG. 14(b) shows the PL intensity as a function of excitation power for samples 2A (circles), 2B (squares), and 3 (triangles). The PL emission intensity changed with excitation power as shown in FIG. 14(a). Within the signal-to-noise ratio for the experiment, the line shape could be described as Gaussian with FWHM 30 meV. As shown in FIG. 14(a), energy of this PL transition does not shift when higher excitation power is used, which suggests that the transition is due to band-to-defect recombination (rather than donor-acceptor recombination). The dependence of PL intensity on laser excitation power can be approximated as PL intensity ∝ (laser power)$^a$, where a≈2 indicates exciton emission, a≈1 is associated with band-to-band recombination at low injection, and a≈0.5 suggests band-to-defect emission. As shown in FIG. 14(b), in this example, a=0.42-0.60; thus, the observed peak reflects band-to-defect transitions.

Figure 15A:
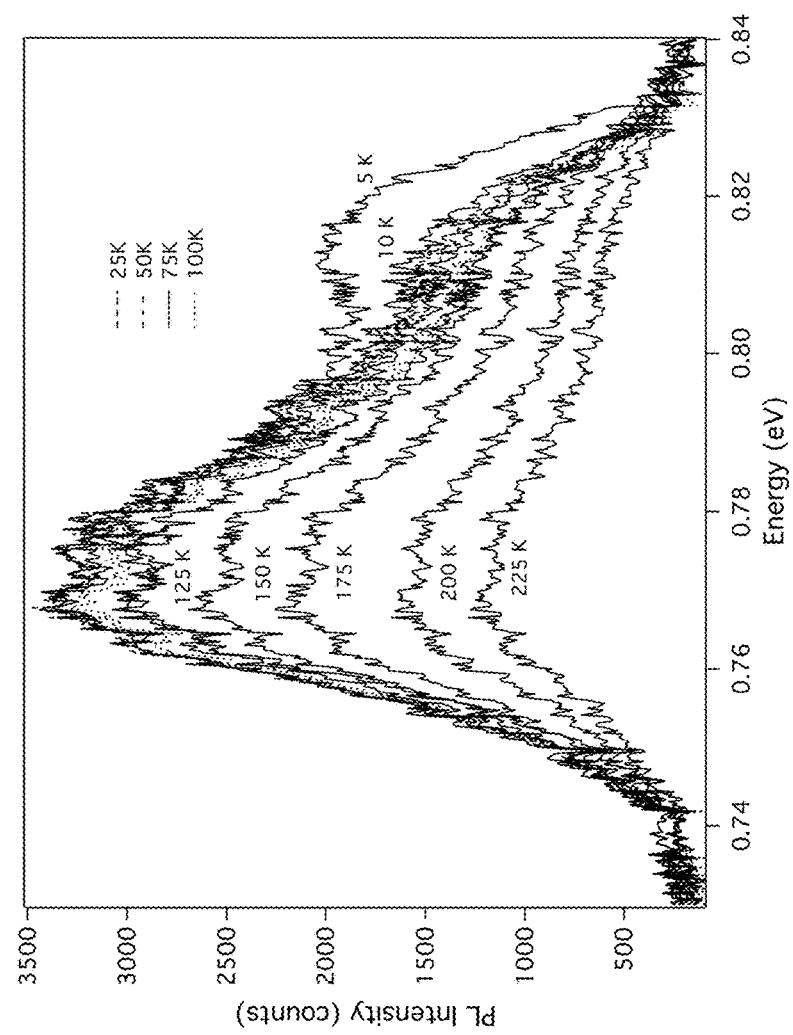
FIGS. 15(a) and 15(b) show the PL intensity as a function of energy at different temperatures and an analysis of the integrated defect PL emission for the CIGS film shown in FIG. 11(b)
Figure 15B:
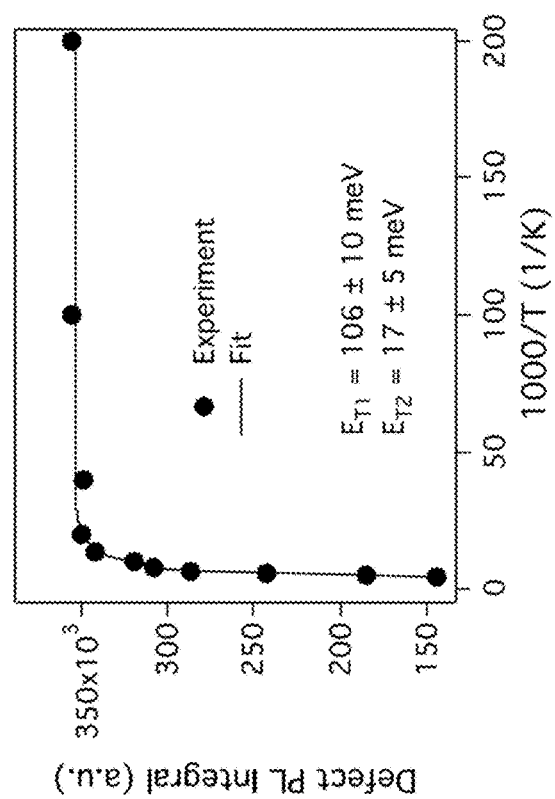

FIG. 15(a) shows the temperature dependence of the PL emission spectra for sample 2A, and FIG. 15(b) shows the analysis of the integrated defect PL emission using the model of Equation (1) below. As shown in FIG. 15(a), the intensity of the PL emission remains relatively constant for temperatures up to 125K. At higher temperatures, the PL intensity decreases. After integrating PL emission spectra at each temperature, the data were fit with the equation:

$$I(T) = \frac{I_0}{1 + \alpha_1 \exp(-E_{T1}/k_B T) + \alpha_2 \exp(-E_{T2}/k_B T)} \quad (1)$$

where I(T) is the integrated intensity of the PL bands at temperature T, $\alpha_1$ and $\alpha_2$ rate parameters, and $k_B$ is Boltzmann's constant. The activation energy $E_{T1}$ is dominant in the high-temperature region and $E_{T2}$ is dominant for the low-temperature region. The best fit in FIG. 15(b) gave $E_{T1}$=106±10 meV and $E_{T2}$=17±5 meV. Similar temperature dependence, where PL emission intensity was approximately constant at 4-125 K and decreased at higher temperatures, was observed for other samples. However, activation energies $E_{T1}$ and $E_{T2}$ were somewhat sample-dependent. In addition, some defect PL emission spectra could be described by a single-Gaussian spectral shape (e.g., FIG. 14(a)), whereas in other cases more complex models are necessary (e.g., FIG. 15(a)). Variation in activation energies and emission spectra suggest that more than one defect energy level could be involved in the radiative recombination process. For example, $E_a$≈110 meV could indicate transitions between defect energy levels. This activation energy is too low to be related to band-to-defect recombination.

Figure 16A:
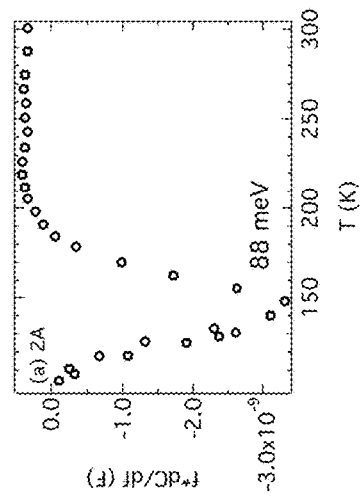
FIGS. 16(a) and 16(b) show admittance spectra for the CIGS films shown in FIGS. 11(b) and 11(c), respectively.
Figure 16B:
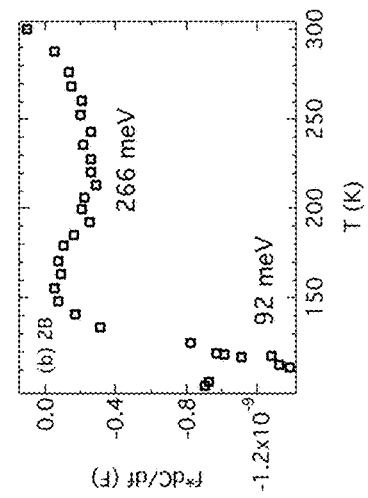

Admittance spectroscopy (AS) may be used to characterize defects in CIGS. Peaks observed in AS are typically associated with electronic levels that can trap the majority carriers. FIGS. 16(a) and 16(b) show AS data measured at 63 kHz for sample 2A and sample 2B, respectively. As shown in FIGS. 16(a) and 16(b), the AS spectra indicate relative shallow defect levels (88 and 92 meV above the valence band, $E_V$) for samples 2A and 2B, respectively. For the sample with larger grains (2B), an additional AS peak is observed at 266 meV above $E_V$. This observation agrees well with the PL result and indicates that a PL peak at 0.78 eV could be attributed to either an acceptor or a deep recombination center ≈0.25 eV above $E_V$. Recent density functional theory analysis for CIGS with Sb incorporation suggests that a defect at ~0.25 eV above the valence band maximum (VBM) is Sb substituting for Se ($Sb_{Se}$).

Figure 17:
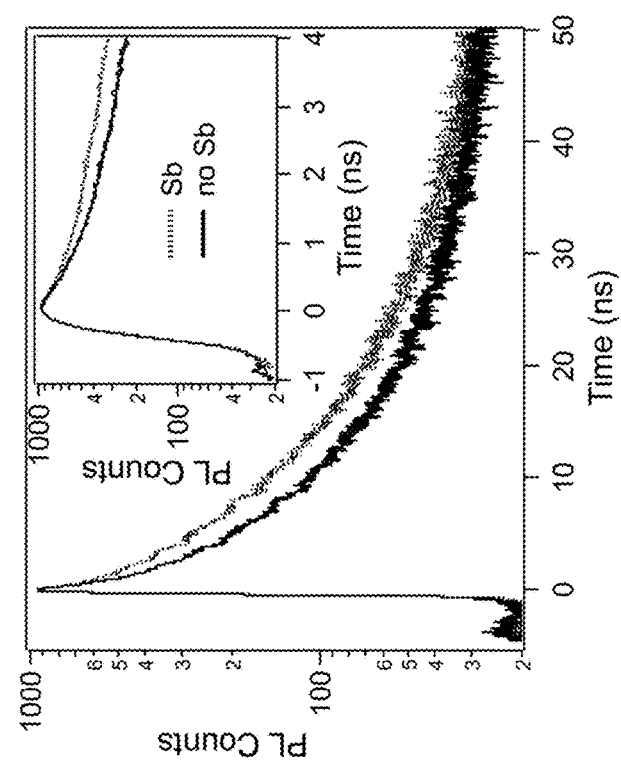
FIG. 17 shows time-resolved photoluminescence (TRPL) decays for two additional CIGS films formed by exemplary embodiments of the present invention.

Changes in compensation caused by Sb may also change the carrier lifetime. To investigate this, TRPL measurements were performed on two additional samples. The samples had identical processing conditions, except that one contained Sb in the precursor step and the other did not. FIG. 17 shows the TRPL decays for both samples. TRPL for the sample including Sb in the precursor step is shown by the upper dotted line, whereas the sample without Sb in the precursor step is shown by the lower solid line. The TRPL decays are not exponential, which might be related to compensation and potential fluctuations. If a two-exponential-fitting model is used, the longer lifetime component $\tau_2$ is in the range of 9-10 ns and might indicate minority-carrier lifetime. As shown in the inset, which includes the first 4 ns, Sb affects the initial component of the decay, which might indicate reduced interface recombination due to Sb. Estimates for changes in interface recombination velocity might be derived from the following considerations. The light absorption depth is 1/α=110 nm, or 2.3/α=250 nm, where a is the absorption coefficient. Therefore, most electron-hole pairs are generated close to the CdS/CIGS interface. On the 0-2-ns time scale, fitting indicates $\tau_1$=0.51±0.02 ns for the sample without Sb, and $\tau_1$=0.63±0.02 ns for the sample with Sb. This recombination occurs close to the interface (on <2 ns time scale, diffusion distance is small) and is faster than recombination in the bulk (described by $\tau_2$=9-10 ns). Therefore, for the sample with Sb, the interface lifetime is about 24% longer. The interface recombination velocity can be estimated from S=1/(α$\tau_1$); therefore, an increase in $\tau_1$ is proportional to a decrease in S. Evaluation of S values is somewhat more uncertain, because in addition to interface recombination other effects, such as drift, could contribute to experimental $\tau_1$ data. Despite this uncertainty, S may be estimated as 2.2×10$^4$ cm/s for the sample without Sb and 1.8×10$^4$ cm/s for the sample with Sb. This estimate for S is higher than the value derived from electrical characterization on CIGS devices fabricated in a related art three-stage process, described in J. V. Li, "A recombination analysis of Cu(In,Ga)Se-2 solar cells with low and high Ga compositions," *Sol. Energy Mater. Sol. Cells*, vol. 124, pp. 143-149, 2014, where $S=2.6\times10^3$ cm/s was found for the average Ga/(Ga+In) composition of 0.30. Because of simplifications made in the analysis of TRPL data, the values for S can be regarded as upper limits for interface recombination velocity. Data might also indicate that interface recombination velocity is higher for CIGS fabricated by the two-step process of exemplary embodiments of the present invention.

The optoelectronic properties of CIGS fabricated by the two-step process of exemplary embodiments of the present invention are different from those fabricated by a related art three-stage process. For example, as discussed above, a low-energy PL peak was observed at 0.79 eV that is not typically seen in CIGS PL. A comparison of PL and AS data indicates that the band-to-defect transition may be enhanced by Sb incorporation in the precursor.

Figure 18B:
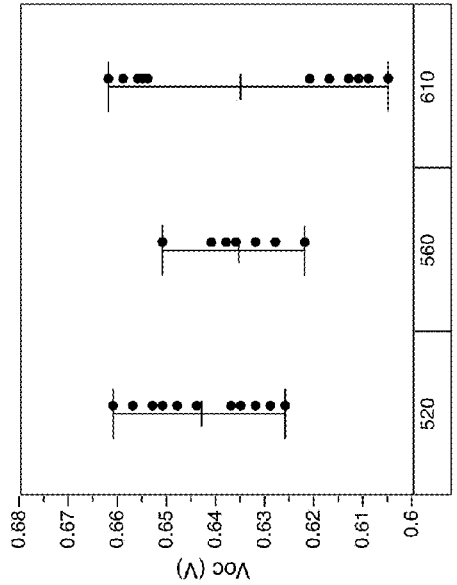
FIGS. 18(a)-18(d) show the efficiency, the $V_{OC}$, the $J_{SC}$, and the FF as functions of the maximum substrate temperature during the selenization step.
Figure 18D:
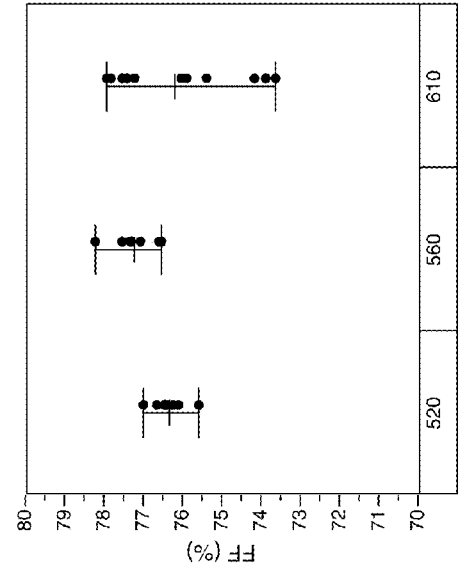
Figure 18A:
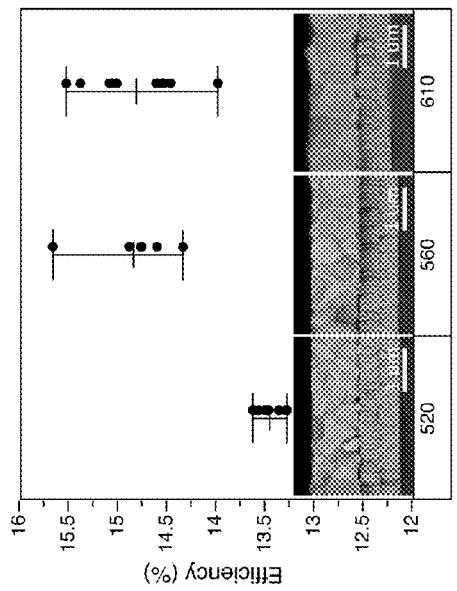
Figure 18C:
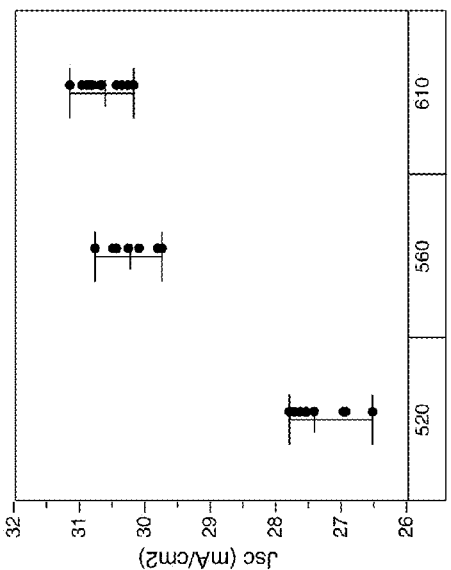

Lower temperature processing may reduce the manufacturing costs of CIGS devices, and provide benefits for applications that require low-temperature CIGS growth, such as tandem devices and CIGS on polyimide substrates. According to exemplary embodiments of the present invention, the maximum substrate temperature during the selenization step (shown as the third plateau in FIG. 3) may be reduced without adversely affecting the device parameters of solar cells incorporating the CIGS films. For example, FIG. 18(a) shows the efficiency as a function of the maximum substrate temperature during the selenization step, FIG. 18(b) shows the $V_{OC}$ as a function of the maximum substrate temperature during the selenization step, FIG. 18(c) shows the $J_{SC}$ as a function of the maximum substrate temperature during the selenization step, and FIG. 18(d) shows the FF as a function of the maximum substrate temperature during the selenization step. While there is some decrease in the efficiency and the $J_{SC}$ for maximum substrate temperatures near 520° C., the efficiency, $J_{SC}$, $V_{OC}$, and FF remain high for maximum substrate temperatures near 560° C. Additional results show that the $V_{OC}$ is above 600 mV for maximum substrate temperatures greater than or equal to approximately 470° C., and that the FF is above 75% for maximum substrate temperatures greater than or equal to approximately 520° C.

The maximum substrate temperature during the selenization step also affects the grain size of the film. For example, FIG. 19(a) shows a cross-sectional SEM image of a film produced with a maximum substrate temperature during the selenization step of 400° C., FIG. 19(b) shows a cross-sectional SEM image of a film produced with a maximum substrate temperature during the selenization step of 520° C., FIG. 19(c) shows a cross-sectional SEM image of a film produced with a maximum substrate temperature during the selenization step of 560° C., and FIG. 19(d) shows a cross-sectional SEM image of a film produced with a maximum substrate temperature during the selenization step of 610° C. The films shown in FIGS. 19(a)-19(d) were produced with Sb included in the precursor step. For comparison, FIG. 19(e) shows a cross-sectional SEM image of a film produced with a maximum substrate temperature during the selenization step of 600° C., but without Sb included in the precursor step.

As shown in FIG. 19(a), the 400° C. selenization step results in films with very small grains. As the selenization temperature increases, the grain size also increases. Because there is still good crystallization at a selenization temperature of 520° C., it is likely that the selenization temperature can be reduced without sacrificing device performance. FIG. 19(e) shows that if Sb is not included in the precursor step, selenizing at a relatively high temperature of 600° C. does not provide the large grain sizes that are seen with the Sb films.

Figure 20:
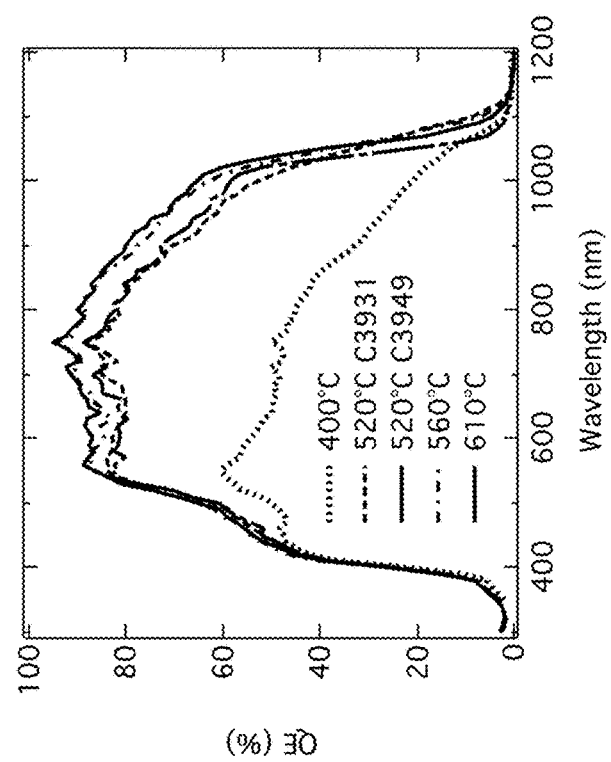
FIG. 20 shows the QE as a function of wavelength for CIGS films produced at different maximum substrate temperatures during the selenization step.

FIG. 20 shows the QE as a function of wavelength for films produced at different maximum substrate temperatures during the selenization step. As shown in FIG. 20, the QE is low for a film produced at a maximum substrate temperature of 400° C. This is due to the poor material quality and an incomplete reaction of the precursor materials. Further, the suppressed collection shows a wavelength-independent recombination. However, the QE is similar for films produced at maximum substrate temperatures of 560° C. and 610° C., and slightly lower for films produced at a maximum substrate temperature of 520° C.

Figure 21A:
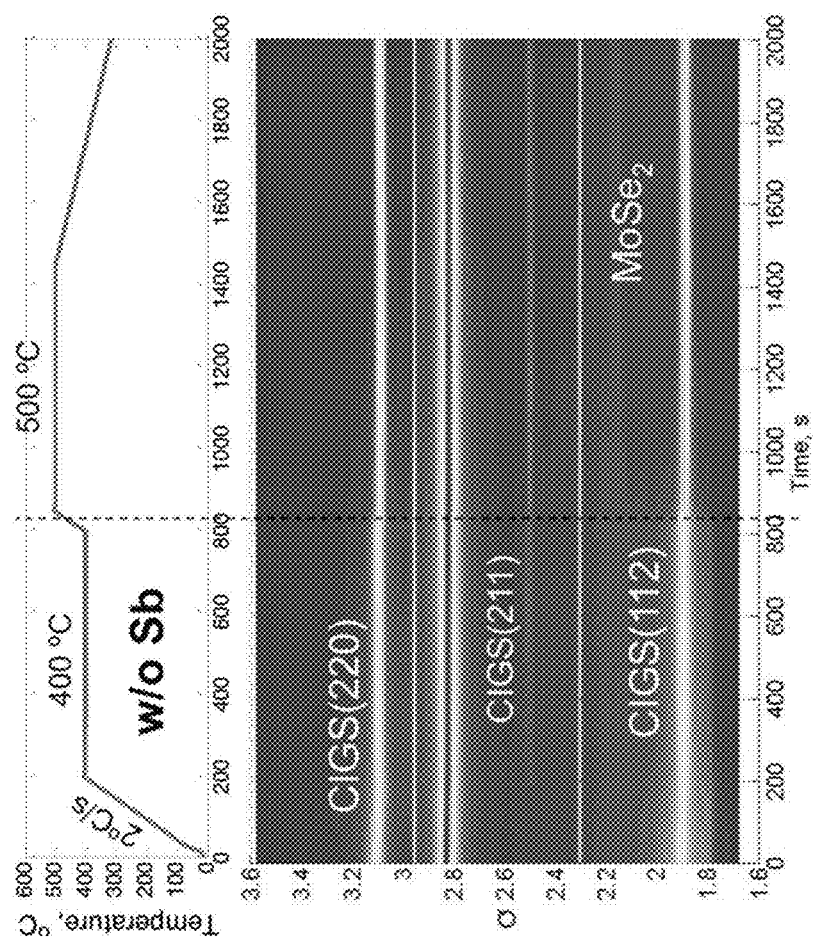
FIGS. 21(a) and 21(b) show structural changes to CIGS films formed by exemplary embodiments of the present invention and heated by rapid thermal processing (RTP)
Figure 21B:
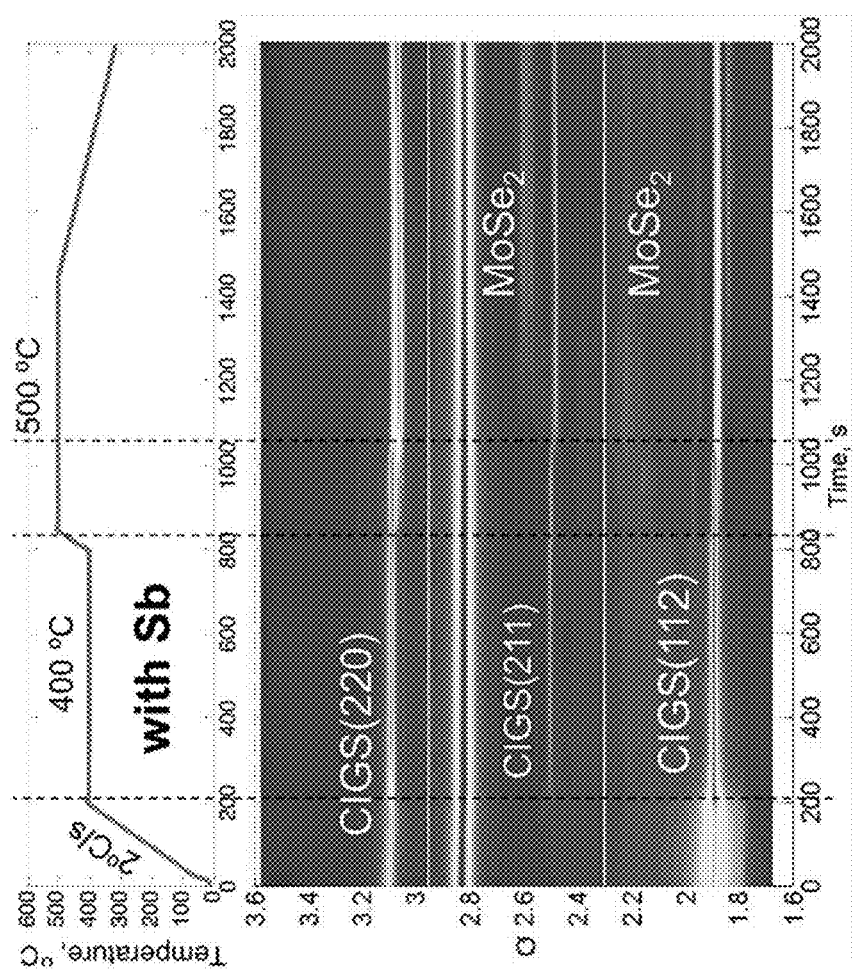

Films grown according to the methods discussed above were also evaluated by monitoring structural changes to the material in situ with x-ray diffraction (XRD) while heating the material by rapid thermal processing (RTP). FIG. 21(a) shows the results for a film produced without Sb in the precursor step, and FIG. 21(b) shows the results for a film produced with Sb in the precursor step. As shown in FIG. 21(a) and F(b), using Sb in the precursor step induces phase changes in the material at a lower temperature. The broad peaks show disorder and/or small grains, and a transition to order happens quickly. Peak narrowing occurs at 500° C. in the film produced without Sb in the precursor step, and at 400° C. in the film produced with Sb in the precursor step. Accordingly, lower temperature processing and shorter selenization times may be possible by including Sb in the precursor step.

Figure 22B:
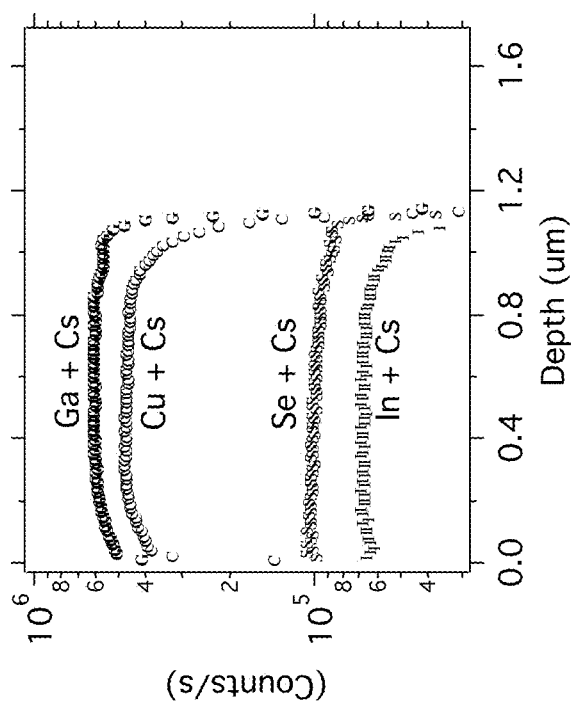
FIGS. 22(a) and 22(b) show a cross-sectional SEM image and a SIMS depth profile, respectively, of a CIGS film produced with a high amount of Ga according to exemplary embodiments of the present invention.
Figure 22A:
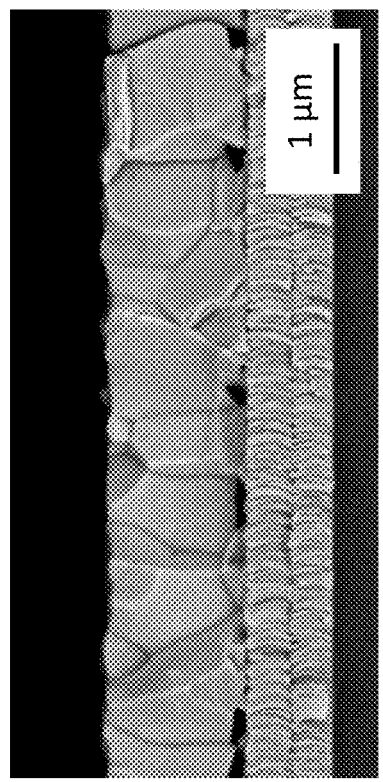

As discussed above, the Ga/(In+Ga) ratio deposited onto the substrate during the precursor step may be between 0 and 1.0, such as approximately 0.33. In some exemplary embodiments, the amount of Ga may be increased such that the Ga/(In+Ga) ratio is approximately 0.5. FIG. 22(a) shows a cross-sectional SEM image of a CIGS film produced with a Ga/(In+Ga) ratio of approximately 0.5 during the precursor step, and FIG. 22(b) shows a SIMS depth profile of this film. The film has large grains throughout the sample, and the Ga is well-distributed. Also, a device incorporating the film and having an AR coating has an efficiency of 15.2%, a $V_{OC}$ of 0.749, a $J_{SC}$ of 26.8 mA/cm$^2$, a FF of 75.8%, and a QE bandgap of 1.26. Accordingly, the device has a higher $V_{OC}$ and a wider bandgap than devices incorporating CIGS films that are produced with less Ga during the precursor step.

In order to fabricate high-efficiency devices, it may be beneficial to control the Ga migration through the CIGS film thickness. FIG. 23(a) shows secondary ion mass spectrometry (SIMS) depth profiles of the film produced in run 4, FIG. 23(b) shows SIMS depth profiles of the film produced in run 5, and FIG. 23(c) shows SIMS depth profiles of the film produced in run 15. As often occurs in two-step processed films, the film produced in run 4 had an extremely sloped Ga profile with high Ga in the back of the film near the Mo/CIGS interface, and low Ga at the film surface as seen in FIG. 23(a). This caused a low $V_{OC}$ that limited the device efficiency. However, the Ga is quite homogenous when the Se in the precursor is above a certain concentration, such as in the film produced in run 5 and shown in FIG. 23(b).

Figure 24:
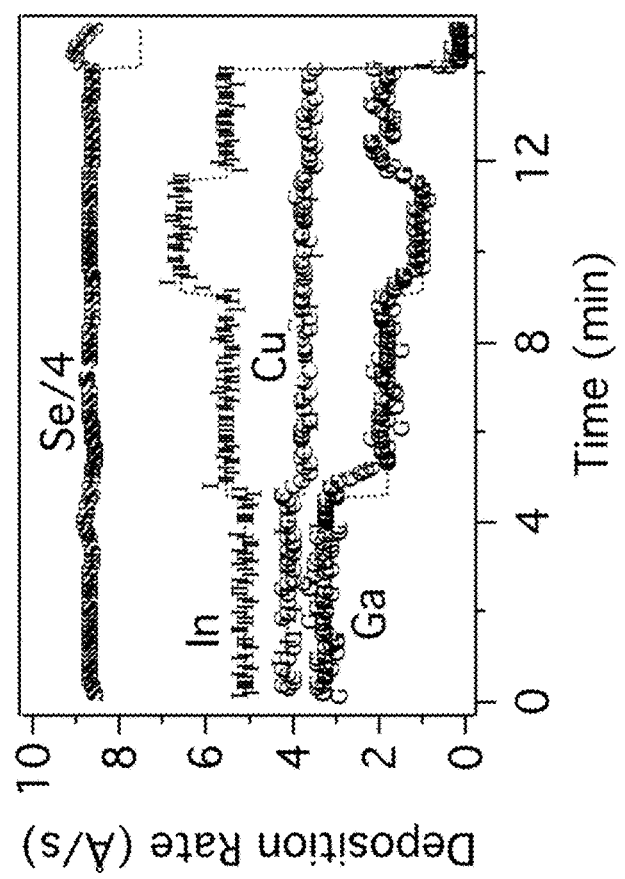
FIG. 24 shows a graph of the deposition rates for the elements used to fabricate an intentionally graded CIGS film according to exemplary embodiments of the present invention.

In view of the above, an intentionally graded Sb-containing precursor may be fabricated according to exemplary embodiments of the present invention. For example, an intentional Ga gradient was introduced into the film produced in run 15. The precursor gradient was accomplished by stepping the Ga and In fluxes in the precursor while the Cu and Se fluxes remained relatively constant. FIG. 24 is a graph of the deposition rates for all elements during the precursor step used to fabricate the intentionally graded film.

As shown in FIG. 23(c), a Ga gradient remained in the selenized film produced in run 15. Due to the additional precursor growth time, the graded film was thicker than the other films. External quantum efficiency measurements (not shown) support the claim that the Ga gradient increases the $J_{SC}$ by enhancing current collection in the longer wavelengths due to a stronger electric field in the device as shown in O. Lundberg, M. Edoff, and L. Stolt, "The effect of Ga-grading in CIGS thin film solar cells," *Thin Solid Films*, vol. 480-481, pp. 520-525, 2005. The solar cell made from the intentionally graded film produced in run 15 out-performed the rest of the devices with an efficiency of 16.9% after an anti-reflective coating was applied.

The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

What is claimed is:

1. A method of forming a CIGS film, the method comprising:
    a precursor step comprising simultaneously evaporating Cu, In, Ga, Se, and Sb onto a substrate, wherein the Se is incident on the substrate at a rate of at least 20 Å/s and the Sb is incident on the substrate at a rate of at least 0.2 Å/s; and
    a selenization step comprising evaporating Se over the substrate after the precursor step.

2. The method according to claim 1, wherein the precursor step further comprises maintaining the substrate at a first temperature during a first time period.

3. The method according to claim 2, wherein the selenization step further comprises:
    maintaining the substrate at a second temperature that is higher than the first temperature during a second time period; and
    subsequently maintaining the substrate at a third temperature that is higher than the second temperature during a third time period.

4. The method according to claim 2, wherein the first temperature is below approximately 350° C.

5. The method according to claim 3, wherein the selenization step further comprises:
    after the third time period, stopping the evaporation of the Se when the temperature of the substrate falls below a fourth temperature that is lower than the second temperature.

6. The method according to claim 3, wherein the third temperature is between approximately 400° C. and approximately 610° C.

7. The method according to claim 3, wherein the third temperature is between approximately 470° C. and approximately 610° C.

8. The method according to claim 1, wherein a ratio of Cu/(In+Ga) deposited onto the substrate during the precursor step is between 0.75 and 1.

9. The method according to claim 1, wherein a ratio of Ga/(In+Ga) deposited onto the substrate during the precursor step is approximately 0.33.

10. The method according to claim 1, wherein a ratio of Ga/(In+Ga) deposited onto the substrate during the precursor step is approximately 0.5.

11. The method according to claim 1, wherein a ratio of Sb/(Cu+In+Ga) deposited onto the substrate during the precursor step is between 0.01 and 0.04.

12. The method according to claim 1, wherein a ratio of Se/(Cu+In+Ga) deposited onto the substrate during the precursor step is between 0.88 and 1.8.

13. The method according to claim 1, wherein the Se is incident on the substrate at a rate of approximately 30 Å/s during the selenization step.

14. The method according to claim 1, wherein the precursor step further comprises stepping fluxes of the Ga and the In to produce a gradient of the Ga in the film.

15. A method of forming a CIGS film, the method comprising:
    a precursor step comprising simultaneously evaporating Cu, In, Ga, Se, and Sb onto a substrate, wherein the Se is incident on the substrate at a rate of at least 20 Å/s; and
    a selenization step comprising evaporating Se over the substrate after the precursor step, wherein:
    the precursor step further comprises maintaining the substrate at a first temperature during a first time period, and
    the selenization step further comprises:
        maintaining the substrate at a second temperature that is higher than the first temperature during a second time period; and
        subsequently maintaining the substrate at a third temperature that is higher than the second temperature during a third time period.

16. The method according to claim 15, wherein the selenization step further comprises:
    after the third time period, stopping the evaporation of the Se when the temperature of the substrate falls below a fourth temperature that is lower than the second temperature.

17. The method according to claim 15, wherein the first temperature is below approximately 350° C.

18. The method according to claim 15, wherein the third temperature is between approximately 400° C. and approximately 610° C.

19. The method according to claim 15, wherein the third temperature is between approximately 470° C. and approximately 610° C.

20. A method of forming a CIGS film, the method comprising:
    a precursor step comprising simultaneously evaporating Cu, In, Ga, Se, and Sb onto a substrate, wherein the Se is incident on the substrate at a rate of at least 20 Å/s; and
    a selenization step comprising evaporating Se over the substrate after the precursor step,
    wherein the precursor step further comprises stepping fluxes of the Ga and the In to produce a gradient of the Ga in the film.

* * * * *